United States Patent

Song

(10) Patent No.: US 12,176,019 B2
(45) Date of Patent: Dec. 24, 2024

(54) SEMICONDUCTOR DEVICE FOR EXECUTING A SMART REFRESH OPERATION AND A SMART REFRESH METHOD

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 293 days.

(21) Appl. No.: 17/964,718

(22) Filed: Oct. 12, 2022

(65) Prior Publication Data

US 2023/0377627 A1 Nov. 23, 2023

(30) Foreign Application Priority Data

May 23, 2022 (KR) .................. 10-2022-0062936

(51) Int. Cl.
G11C 11/406 (2006.01)
G11C 11/408 (2006.01)

(52) U.S. Cl.
CPC .... *G11C 11/40618* (2013.01); *G11C 11/4087* (2013.01)

(58) Field of Classification Search
CPC .......... G11C 11/40618; G11C 11/4087; G11C 11/40603; G11C 11/40611; G11C 11/4072
USPC ........................................................ 365/222
See application file for complete search history.

(56) References Cited

U.S. PATENT DOCUMENTS

| | | | |
|---|---|---|---|
| 9,892,779 B2 * | 2/2018 | Kang | G11C 11/40618 |
| 11,087,819 B2 | 8/2021 | Cowles et al. | |
| 2016/0329089 A1 * | 11/2016 | Lim | G11C 11/406 |
| 2021/0005246 A1 * | 1/2021 | Kim | G11C 29/50016 |
| 2023/0111467 A1 * | 4/2023 | Cho | G11C 29/783 |
| | | | 365/185.09 |

FOREIGN PATENT DOCUMENTS

| KR | 1020190128890 A | 11/2019 |
|---|---|---|
| KR | 1020190130262 A | 11/2019 |

* cited by examiner

*Primary Examiner* — Huan Hoang
*Assistant Examiner* — Minh Dinh
(74) *Attorney, Agent, or Firm* — WILLIAM PARK & ASSOCIATES LTD.

(57) ABSTRACT

A semiconductor device includes a memory circuit including first and second banks and configured to count the numbers of inputs of first and second active signals for executing active operations on the first and second banks to generate a counting signal and to generate first and second hammering detection signals when the numbers of inputs of the first and second active signals are equal to or greater than a set number, and an active control circuit configured to store an active address as a target address when at least one of the first and second hammering detection signals is enabled, and to execute addition and subtraction operations on the target address to output a result of the addition and subtraction operations as an internal address for at least one of the first and second banks for executing a smart refresh operation, based on the counting signal in a refresh operation.

31 Claims, 22 Drawing Sheets

SEMICONDUCTOR DEVICE FOR EXECUTING A SMART REFRESH OPERATION AND A SMART REFRESH METHOD

CROSS-REFERENCE TO RELATED APPLICATION

The present application claims priority under 35 U.S.C 119(a) to Korean Application No. 10-2022-0062936, filed on May 23, 2022, which is incorporated herein by reference in its entirety.

BACKGROUND

1. Technical Field

The present disclosure generally relates to a semiconductor device, and more particularly, to a semiconductor device for executing a smart refresh operation and a smart refresh method.

2. Related Art

A semiconductor device includes a plurality of memory cells for storing data. Each of the memory cells include a cell capacitor and a cell transistor. The semiconductor stores data through an operation of charging or discharging electric charge in the cell capacitor, and the amount of the electric charge stored in the cell capacitor should ideally always be constant. However, the amount of charge stored in the cell capacitor changes due to a voltage difference with the peripheral circuit. As such, the change in the charge amount of the cell capacitor means that the data stored in the cell capacitor is changed, which means that the stored data is lost. The semiconductor device executes a refresh operation to prevent data loss as described above.

On the other hand, as process technology develops, the degree of integration of semiconductor devices gradually increases, and the interval between memory cells is reduced. Thus, the interval between word lines that are connected to each of the memory cells is decreasing. When the interval between word lines is decreased, an interference effect may occur between adjacent word lines, and data stored in a memory cell connected to the corresponding word line may be difficult to maintain. That is, the probability that data may be lost increases.

SUMMARY

A semiconductor device according to an embodiment of the present disclosure may include a memory circuit including first and second banks, the memory circuit configured to count the numbers of input times of first and second active signals for executing an active operation on the first and second banks to generate a counting signal and to generate first and second hammering detection signals when the numbers of input times of the first and second active signals are equal to or greater than a set number of times. The semiconductor device may also include an active control circuit configured to store an active address as a target address when at least one of the first and second hammering detection signals is enabled, and to execute addition and subtraction operations on the target address to output a result of the addition and subtraction operations as an internal address for at least one of the first and second banks for executing a smart refresh operation, based on the counting signal in a refresh operation.

In addition, a semiconductor device according to an embodiment of the present disclosure may include a bank configured to count the number of input times of an active signal for executing an active operation to generate a counting signal, to store the counting signal, and to generate a hammering detection signal when the number of input times of the active signal is equal to or greater than a set number of times. The semiconductor device may also include a refresh control circuit configured to generate first and second smart refresh signals for executing a smart refresh operation based on the hammering detection signal in a refresh operation, and to generate one of a refresh active signal and a smart refresh active signal, based on a refresh command.

In addition, an embodiment of the present disclosure may provide a smart refresh method including performing an active detecting step of detecting numbers of input times of first and second active signals in an active operation, generating first and second hammering detection signals when the numbers of input times of the first and second active signals are equal to or greater than a set number of times, respectively, and storing a target address. The smart refresh method may also include performing an operation executing step of executing addition and subtraction operations on the target address to execute a smart refresh operation on one of first and second banks when one of the first and second hammering detection signals is enabled in a refresh operation, and executing the refresh operation on the bank on which the smart refresh operation is not executed among the first and second banks.

DETAILED DESCRIPTION

In the following description of embodiments, when a parameter is referred to as being "predetermined," it may be intended to mean that a value of the parameter is determined in advance of when the parameter is used in a process or an algorithm. The value of the parameter may be set as the process or the algorithm starts or may be set while the process or the algorithm is being executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in more detail with reference to the accompanying drawings. However, the embodiments described herein are for illustrative purposes only and are not intended to limit the scope of the present disclosure.

Figure 1:
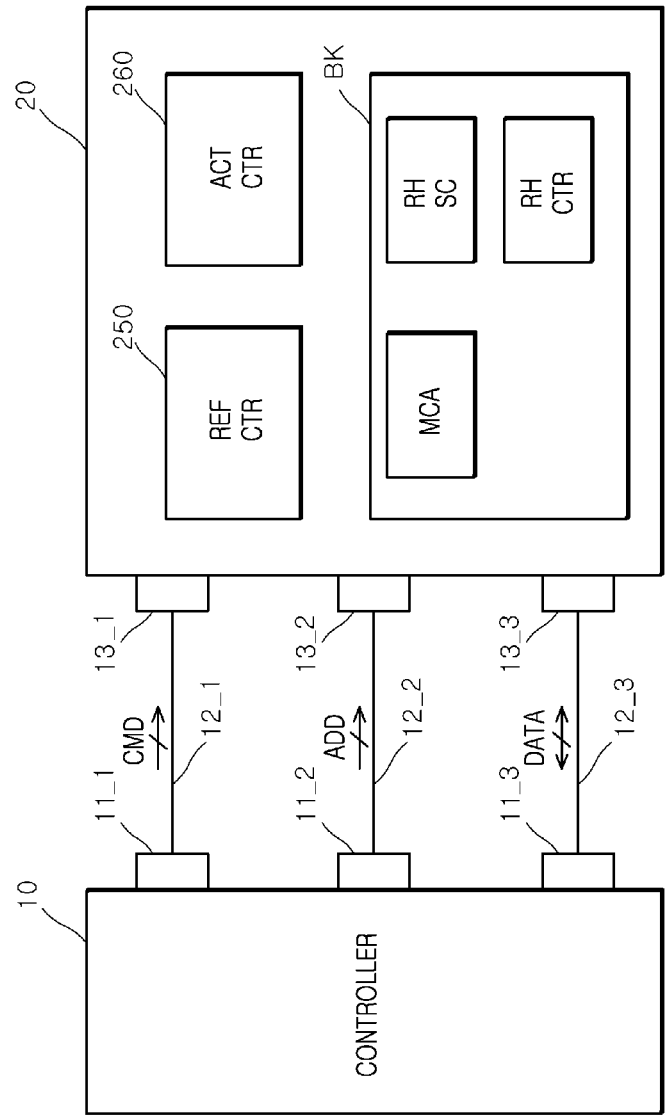
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As shown in FIG. 1, the semiconductor system 1 may include a controller 10 and a semiconductor device 20. The semiconductor device 20 may include a bank BK, a refresh control circuit 250, and an active control circuit 260.

The controller 10 may include a first control pin 11_1, a second control pin 11_2, and a third control pin 11_3. The semiconductor device 20 may include a first device pin 13_1, a second device pin 13_2, and a third device pin 13_3. A first transmission line 12_1 may be connected between the first control pin 11_1 and the first device pin 13_1. The second transmission line 12_2 may be connected between the second control pin 11_2 and the second device pin 13_2. The third transmission line 12_3 may be connected between the third control pin 11_3 and the third device pin 13_3. The controller 10 may output a command CMD to the semiconductor device 20 through the first transmission line 12_1. The controller 10 may output an address ADD to the semiconductor device 20 through the second transmission line 12_2. The controller may output data DATA to the semiconductor device 20 through third transmission line 12_3, and may receive the data DATA from the semiconductor device 20 through the third transmission line 12_3. Each of the command CMD and the address ADD may include a plurality of bits for controlling the operations of the semiconductor device 20. The data DATA may include a plurality of bits.

Figure 2:
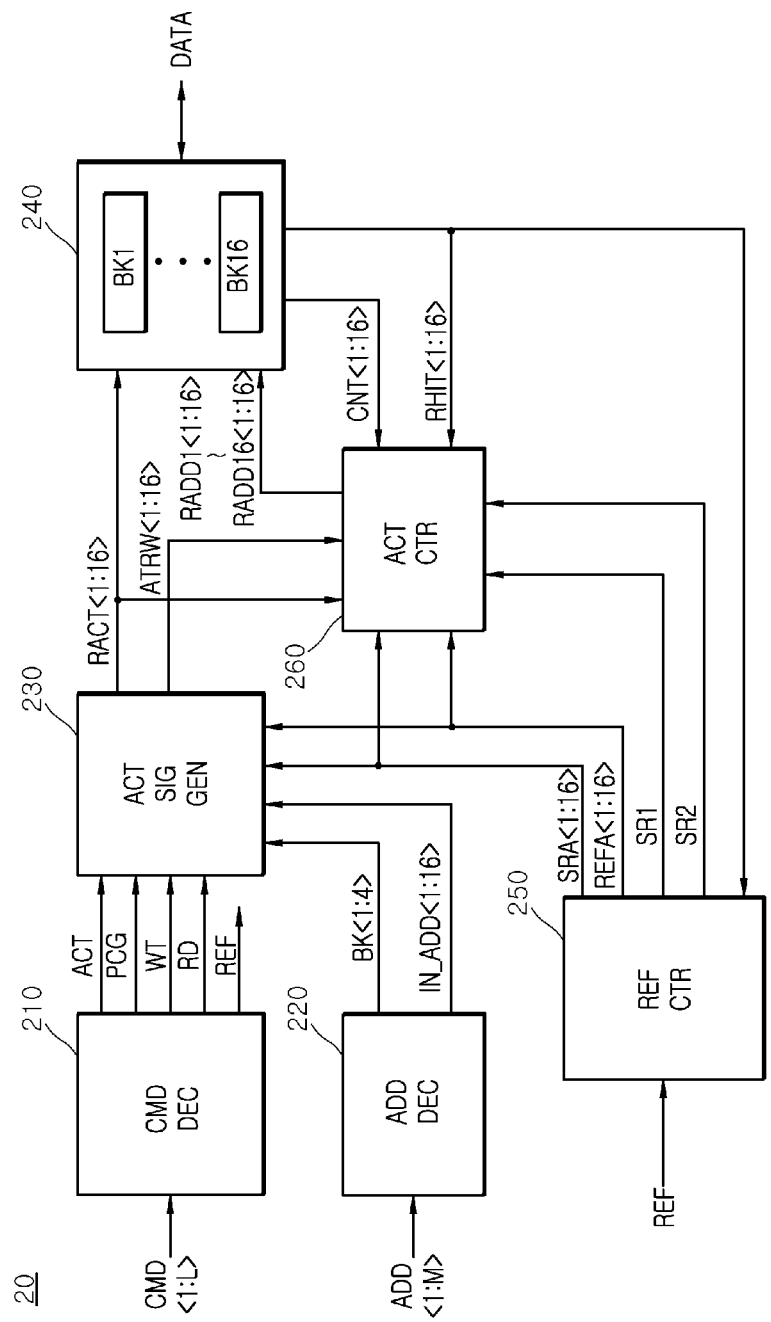
FIG. 2 is a block diagram illustrating a configuration according to an embodiment of a semiconductor device included in the semiconductor system according to an embodiment of the present disclosure.

The bank BK may count the number of input times of active signals (RACT<1:16> of FIG. 2) for executing an active operation, based on the command CMD to generate counting signals (CNT<1:16> of FIG. 2). The bank BK may store the counting signals (CNT<1:16> of FIG. 2), and may generate hammering detection signals (RHIT<1:16> of FIG. 2) when the number of input times of the active signals (RACT<1:16> of FIG. 2) is equal to or greater than a set number of times. The bank BK may be set as one of the first to sixteenth banks BK1-BK16 shown in FIG. 2.

The refresh control circuit 250 may generate first and second smart refresh signals (SR1 and SR2 of FIG. 2) for executing a smart refresh operation, based on the hammering detection signals (RHIT<1:16> of FIG. 2) in a refresh operation. The fresh control circuit 250 may generate one of refresh active signals (REFA<1:16> of FIG. 2) and smart refresh active signals (SRA<1:16> of FIG. 2), based on the command CMD.

The active control circuit 260 may store active addresses (ATRW<1:16> of FIG. 2) as target addresses (TG_ADD<1: 16> of FIG. 11) when one of the hammering detection signals (RHIT<1:16> of FIG. 2) is enabled. The active control circuit 260 may execute addition and subtraction operations on the target addresses (TG_ADD<1:16> of FIG. 11) for executing a smart refresh operation based on the counting signals (CNT<1:16> of FIG. 2) in the refresh operation to output a result of the addition and subtraction operations as a plurality of internal addresses (RADD1<1: 16>-RADD16<1:16> of FIG. 2) that are used in the first to sixteenth banks BK1-BK16, based on the command CMD.

The semiconductor device 20 may count the number of input times of the active signals (RACT<1:16> of FIG. 2) for executing an active operation to generate the counting signals (CNT<1:16 of FIG. 2). The semiconductor device 20 may store the generated counting signals (CNT<1:16 of FIG. 2). The semiconductor device 20 may generate the hammering detection signals (RHIT<1:16> of FIG. 2) when the number of input times of the active signal (RACT<1:16> of FIG. 2) is equal to or greater than a set number of times. The semiconductor device 20 may execute the smart refresh operation, based on the hammering detection signals (RHIT<1:16> of FIG. 2) in the refresh operation.

FIG. 2 is a block diagram illustrating a configuration according to an embodiment of a semiconductor device 20. As shown in FIG. 2, the semiconductor device 20 may include a command decoder 210, an address decoder 220, an active signal generating circuit 230, a memory circuit 240, a refresh control circuit 250, and an active control circuit 260.

The command decoder 210 may generate an active command ACT, a pre-charge command PCG, a write command WT, a read command RD, and a refresh command REF, based on first to "L"$^{th}$ commands CMD<1:L>. The command decoder 210 may decode the first to "L"$^{th}$ commands CMD<1:L> to generate the active command ACT for executing an active operation. The command decoder 210 may decode the first to "L"$^{th}$ commands CMD<1:L> to generate the pre-charge command PCG for executing a pre-charge operation. The command decoder 210 may decode the first to "L"$^{th}$ commands CMD<1:L> to generate the write command WT for executing a write operation. The command decoder 210 may decode the first to "L"$^{th}$ commands CMD<1:L> to generate the read command RD for executing a read operation. The command decoder 210 may decode the first to "L"$^{th}$ commands CMD<1:L> to generate the refresh command REF for executing a refresh operation. The active command ACT may be generated for the active operation before the write operation and read operation are executed. The number of bits "L" of the first to "L"$^{th}$ commands CMD<1:L> may be variously set according to embodiments. The number of bits "L" of the first to "L"$^{th}$ commands CMD<1:L> may be set as a natural number.

The address decoder 220 may generate first to fourth bank addresses BK<1:4> and first to sixteenth input addresses IN_ADD<1:16>, based on first to "M"$^{th}$ addresses ADD<1:M>. The address decoder 220 may decode the first to "M"$^{th}$ addresses ADD<1:M> to generate the first to fourth bank addresses BK<1:4> and the first to sixteenth input addresses IN_ADD<1:16>. The number of bits "M" of the first to "M"$^{th}$ addresses ADD<1:M> may be variously set according to embodiments. The number of bits "M" of the first to "M"$^{th}$ addresses ADD<1:M> may be set as a natural number.

The active signal generating circuit 230 may generate first to sixteenth active signals RACT<1:16>, based on the first to fourth bank addresses BK<1:4> in the active operation. The active signal generating circuit 230 may decode the first to fourth bank addresses BK<1:4> to generate the first to sixteenth active signals RACT<1:16> that are selectively enabled in the active operation. The active signal generating circuit 230 may generate first to sixteenth active addresses ATRW<1:16>, based on the first to sixteenth input addresses IN_ADD<1:16> in the active operation. The active signal generating circuit 230 may output the first to sixteenth input addresses IN_ADD<1:16> as the first to sixteenth active addresses ATRW<1:16> in the active operation. The active signal generating circuit 230 may generate the first to sixteenth active signals RACT<1:16> from the first to sixteenth refresh active signals REFA<1:16> or the first to sixteenth smart refresh active signal SRA<1:16> in the refresh operation.

The memory circuit 240 may include first to sixteenth banks BK1-BK16. The memory circuit 240 may count the number of input times of the first to sixteenth active signals RACT<1:16> to generate first to sixteenth counting signals CNT<1:16>. The memory circuit 240 may generate the first to sixteenth hammering detection signals RHIT<1:16> when the number of input times of the first to sixteenth active signals RACT<1:16> is equal to or greater than a set number of times. For example, the first bank BK1 may count the number of input times of the first active signal RACT<1> to generate the first to sixteenth counting signals CNT<1:16>. The first bank BK1 may generate the first hammering detection signal RHIT<1> when the number of input times of the first active signal RACT<1> is equal to or greater than the set number of times. The sixteenth bank BK16 may count the number of input times of the sixteenth active signal RACT<16> to generate the first to sixteenth counting signals CNT<1:16>. The sixteenth bank BK16 may generate the sixteenth hammering detection signal RHIT<16> when the number of input times of the sixteenth active signal RACT<16> is equal to or greater than the set number of times. Because the second to fifteenth banks BK2-BK15 execute the same operation from the first bank BK1 and the sixteenth bank BK16 only with different input/output signals, a detailed description thereof will be omitted.

The memory circuit 240 may execute a refresh operation and a smart refresh operation on the bank that is selected by the first to sixteenth active signals RACT<1:16> or a plurality of internal addresses RADD1<1:16>-RADD16<1:16> in the refresh operation. The internal address RADD1<1:16> among the plurality of internal addresses may be set as the internal address for the first bank BK1, and the internal address RADD16<1:16> may be set as the internal address for the sixteenth bank BK16. For example, the first bank BK1 may execute the refresh operation and the smart refresh operation by the first active signal RACT<1> and the internal address RADD1<1:16> for the first bank BK1. The memory circuit 240 may execute the refresh operation for the bank in which an enabled hammering detection signal is not generated among the first to sixteenth hammering detection signals RHIT<1:16> by the first to sixteenth active signals RACT<1:16> or the plurality of internal addresses RADD1<1:16>-RADD16<1:16> in the refresh operation. The memory circuit 240 may execute the smart refresh operation for the bank in which an enabled hammering detection signal is generated among the first to sixteenth hammering detection signals RHIT<1:16> by the first to sixteenth active signals RACT<1:16> or the plurality of internal addresses RADD1<1:16>-RADD16<1:16> in the refresh operation.

The memory circuit 240 may store data DATA in the bank that is selected by the first to sixteenth active signals RACT<1:16> and the plurality of internal addresses RADD1<1:16>-RADD16<1:16> among the first to sixteenth banks BK1-BK16 in a write operation. For example, in the write operation, the first bank BK1 may store the data DATA by the first active signal RACT<1> and the internal address RADD1<1:16> for the first bank BK1. The memory circuit 240 may output the data DATA stored in the bank that is selected by the first to sixteenth active signals RACT<1: 16> and the plurality of internal addresses RADD1<1:16>-RADD16<1:16> among the first to sixteenth banks BK1-BK16 in a read operation. For example, in the read operation, the first bank BK1 may output the stored data DATA by the first active signal RACT<1> and the internal address RADD1<1:16> for the first bank BK1.

The refresh control circuit 250 may generate first and second smart refresh signals SR1 and SR2 for executing the smart refresh operation, based on the first to sixteenth hammering detection signals RHIT<1:16> in the refresh operation. The refresh control circuit 250 may generate first to sixteenth refresh active signals REFA<1:16> and first to sixteenth smart refresh active signals SRA<1:16>, based on the refresh command REF and the first to sixteenth hammering detection signals RHIT<1:16>. For example, in the refresh operation, the refresh control circuit 250 may generate the first refresh active signal REFA<1> that is disabled when the refresh command REF and the first hammering detection signal RHIT<1> are enabled and the second to sixteenth refresh active signals REFA<2:16> that are enabled when the refresh command REF and the first hammering detection signal RHIT<1> are enabled. The refresh control circuit 250 may generate the first smart refresh active signal SRA<1> that is enabled when the refresh command REF and the first hammering detection signal RHIT<1> are enabled and the second to sixteenth smart refresh active signals SRA<2:16> when the refresh command REF and the first hammering detection signal RHIT<1> are enabled.

The active control circuit 260 may store the first to sixteenth active addresses ATRW<1:16> as first to sixteenth target addresses (TG_ADD<1:16> of FIG. 11) when at least one of the first to sixteenth hammering detection signals RHIT<1:16> is enabled. The active control circuit 260 may execute addition and subtraction operations on the first to sixteenth target addresses (TG_ADD<1:16> of FIG. 11) to generate the plurality of internal addresses RADD1<1:16>-RADD16<1:16> in order to execute the smart refresh operation, based on the first and second smart refresh signals SR1 and SR2 and the first to sixteenth counting signals CNT<1:16> in the refresh operation. The active control circuit 260 may execute the addition operation on the first to sixteenth target addresses (TG_ADD<1:16> of FIG. 11) to generate the plurality of internal addresses RADD1<1:16>-RADD16<1:16>, and then may execute the subtraction operation on the first to sixteenth target addresses (TG_ADD<1:16> of FIG. 11) to generate the plurality of internal addresses RADD1<1:16>-RADD16<1:16>. In the refresh operation, the active control circuit 260 may generate the plurality of internal addresses RADD1<1:16>-RADD16<1:16> that are sequentially counted, based on the first to sixteenth refresh active signals REFA<1:16>.

Figure 3:
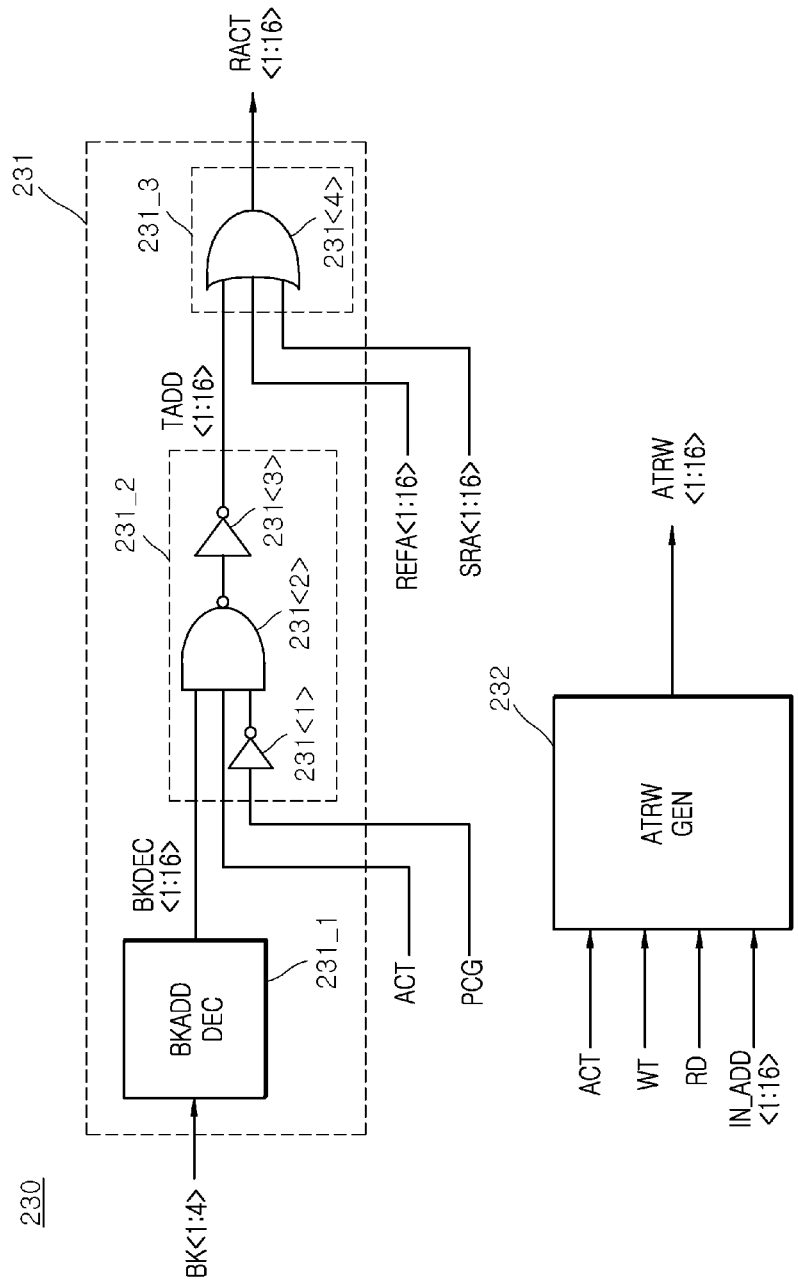
FIG. 3 is a diagram illustrating a configuration according to an embodiment of an active signal generating circuit included in the semiconductor device of FIG. 2.

FIG. 3 is a block diagram illustrating a configuration according to an embodiment of the active signal generating circuit 230 included in the semiconductor device 20 of FIG. 2. As shown in FIG. 3, the active signal generating circuit 230 may include an address transfer circuit 231 and an active address generating circuit 232.

The address transfer circuit 231 may include a bank address decoder 231_1, a transfer address generating circuit 231_2, and an active signal synthesis circuit 231_3.

The bank address decoder 231_1 may generate first to sixteenth bank decoding signals BKDEC<1:16>, based on first to fourth bank addresses BK<1:14>. The bank address decoder 231_1 may decode the first to fourth bank addresses BK<1:14> to generate the first to sixteenth bank decoding signals BKDEC<1:16> that are selectively enabled.

The transfer address generating circuit 231_2 may be implemented with inverters 231_1 and 231_3, and a NAND gate 231_2. The transfer address generating circuit 231_2 may generate first to sixteenth transfer addresses TADD<1:16>, based on an active command ACT, a pre-charge command PCG, and the first to sixteenth bank decoding signals BKDEC<1:16>. The transfer address generating circuit 231_2 may output the first to sixteenth bank decoding signals BKDEC<1:16> as the first to sixteenth transfer addresses TADD<1:16> during the period in which the active command ACT is enabled at a logic "high" level and the pre-charge command PCG is disabled at a logic "low" level. The transfer address generating circuit 231_2 may output the first to sixteenth bank decoding signals BKDEC<1:16> as the first to sixteenth transfer addresses TADD<1:16> that are all disabled at a logic "low" level during the period in which the pre-charge command PCG is enabled at a logic "high" level.

The active signal synthesis circuit 231_3 may be implemented with an OR gate 231_4. The active signal synthesis circuit 231_3 may generate first to sixteenth active signals RACT<1:16> from the first to sixteenth transfer addresses TADD<1:16>, the first to sixteenth refresh active signals REFA<1:16>, or the first to sixteenth smart refresh active signals SRA<1:16>. The active signal synthesis circuit 231_3 may synthesize the first to sixteenth transfer addresses TADD<1:16>, the first to sixteenth refresh active signals REFA<1:16>, and the first to sixteenth smart refresh active signals SRA<1:16> to generate the first to sixteenth active signals RACT<1:16>.

The active address generating circuit 232 may generate first to sixteenth active addresses ATRW<1:16>, based on the active command ACT, the write command WT, the read command RD, and the first to sixteenth input addresses IN_ADD<1:16>. The active address generating circuit 232 may output the first to sixteenth input addresses IN_ADD<1:16> as the first to sixteenth active addresses ATRW<1:16> when one of the active command ACT, the write command WT, the read command RD is enabled.

Figure 4:
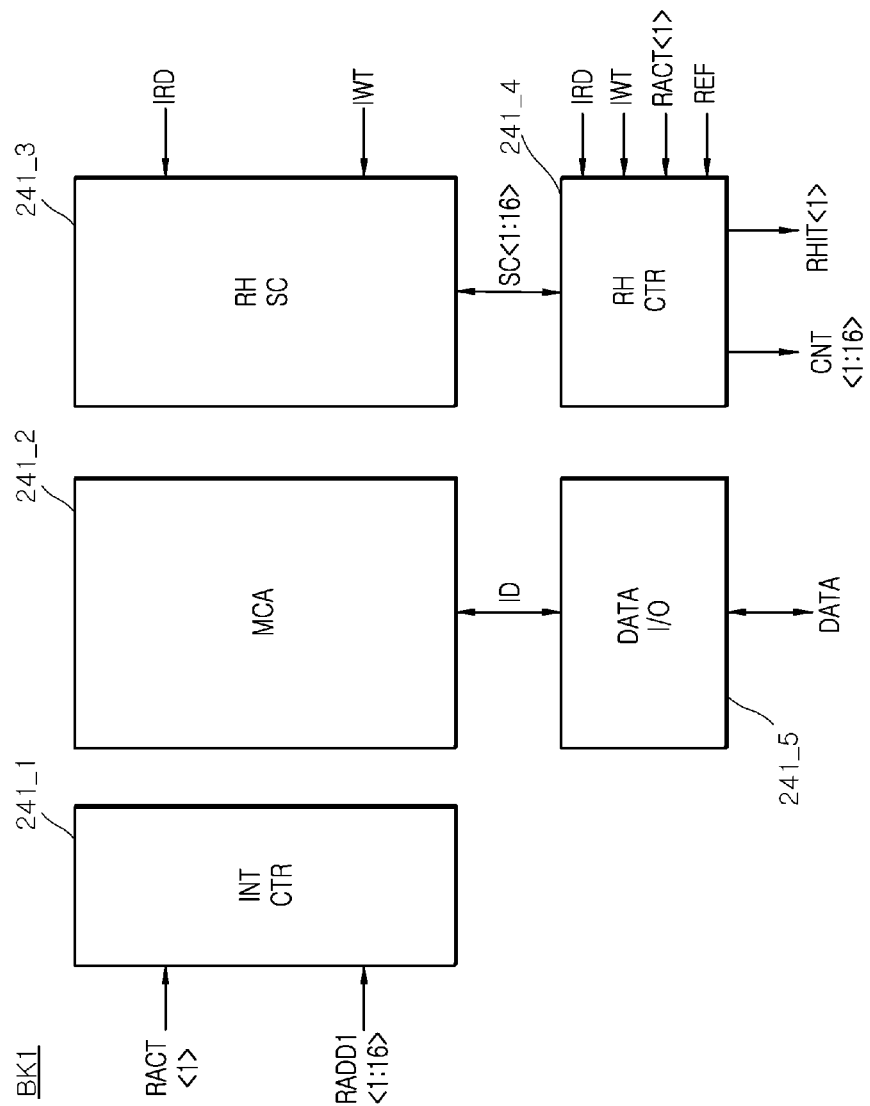
FIG. 4 is a block diagram illustrating a configuration according to an embodiment of a first bank included in the semiconductor device illustrated FIG. 2.

FIG. 4 is a block diagram illustrating a configuration according to an embodiment of the first bank BK1 included in the semiconductor device 20 of FIG. 2. As shown in FIG. 4, the first bank BK1 may include an internal control circuit 241_1, a memory cell array 241_2, a row hammering storage circuit 241_3, a row hammering control circuit 241_4, and a data input/output circuit 241_5.

The internal control circuit 241_1 may activate the memory cell included in the memory cell array 241_2 by the first active signal RACT<1> and the internal address RADD1<1:16> for the first bank BK1. The internal control circuit 241_1 may activate the memory cell included in the memory cell array 241_2 by the internal address RADD1<1:16> for the first bank BK1 when the first active signal RACT<1> is enabled. The internal address RADD<1:16> for the first bank BK1 may include addresses capable of selecting a row path and a column path that are included in the memory cell array 241_2.

The memory cell array 241_2 may store internal data ID in the memory cell that is activated by the internal control circuit 241_1 during a write operation after the active operation. The memory cell array 241_2 may output the internal data ID that is stored in the memory cell that is activated by the internal control circuit 241_1 during a read operation after the active operation. The memory cell array 241_2 may be implemented as a general memory cell array that includes a plurality of word lines and a plurality of memory cells.

The row hammering storage circuit 241_3 may output the stored first to sixteenth storage counting signals SC<1:16> when an internal read signal IRD is enabled in the active operation. The row hammering storage circuit 241_3 may store the first to sixteenth storage counting signals SC<1:16> when an internal write signal IWT is enabled in the active operation. The internal read signal IRD may be set as a signal that is enabled for a predetermined period when the active operation is entered. The internal write signal IWT may be set as a signal that is enabled for a predetermined period after the internal read signal IRD is enabled when the active operation is entered.

The row hammering control circuit 241_4 may up-count the first to sixteenth storage counting signals SC<1:16>, based on the internal read signal IRD and the first active signal RACT<1> in the active operation. The row hammering control circuit 241_4 may up-count the first to sixteenth storage counting signals SC<1:16> that are output from the row hammering storage circuit 241_3 when the internal read signal IRD and the first active signal RACT<1> are enabled in the active operation. The row hammering control circuit 241_4 may generate the first hammering detection signal RHIT<1> that is enabled when the number of input times of the first to sixteenth storage counting signals SC<1:16> is equal to or greater than a set number of times. The row hammering control circuit 2241_4 may output the up-counted first to sixteenth storage counting signals SC<1:16> as first to sixteenth counting signals CNT<1:16>. The row hammering control circuit 241_4 may output the up-counted first to sixteenth storage counting signals SC<1:16> to the row hammering storage circuit 241_3, based on the internal write signal IWT and the first active signal RACT<1> in the active operation. The row hammering control circuit 241_4 may initialize the first to sixteenth storage counting signals SC<1:16> in the refresh operation. The row hammering control circuit 241_4 may generate the first to sixteenth storage counting signals SC<1:16> in which all bits are initialized at a logic "low" level when a refresh command REF is enabled in the refresh operation.

The data input/output circuit 241_5 may generate the internal data ID from data DATA during the write operation after the active operation. The data input/output circuit 241_5 may output the internal data ID to the memory cell array 241_2 during the write operation after the active operation. The data input/output circuit 241_5 may generate the data DATA from the internal data ID during the read operation after the active operation. The data input/output circuit 241_5 may output the internal data ID that is output from the memory cell array 241_2 as the data DATA during the read operation after the active operation.

Meanwhile, because the second to sixteenth banks BK2-BK16 may execute the same operations from the first bank BK1 and the sixteenth bank BK16 only with different input/output signals, a detailed description thereof will be omitted.

Figure 5:
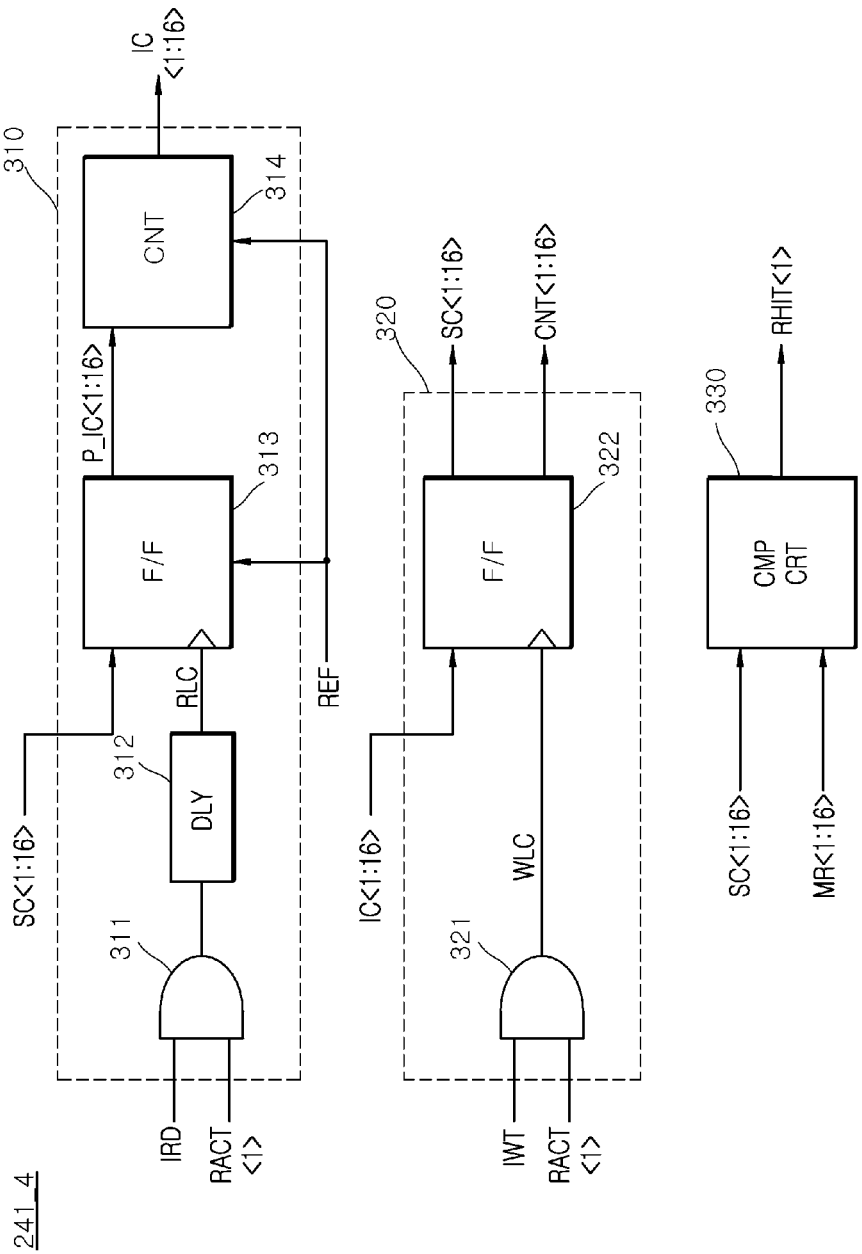
FIG. 5 is a diagram illustrating a configuration according to an embodiment of a row hammering control circuit included in the first bank illustrated in FIG. 4.

FIG. 5 is a diagram illustrating a configuration according to an embodiment of the row hammering control circuit 241_4 included in the first bank BK1 illustrated in FIG. 4. Referring to FIG. 5, the row hammering control circuit 241_4 may include an internal counting signal generating circuit 310, a counting signal output circuit 320, and a comparison circuit 330.

The internal counting signal generating circuit 310 may be implemented with an AND gate 311, a delay circuit 312, a flip flop 313, and a counter 314.

The AND gate 311 and the delay circuit 312 may generate a read latch control signal RLC that is enabled at a logic "high" level when an internal read signal IRD and a first active signal RACT<1> are enabled at a logic "high" level and a delay time of the delay circuit 312 elapses. The flip flop 313 may latch first to sixteenth storage counting signals SC<1:16> when the read latch control signal RLC is enabled at a logic "high" level, and may output the latched first to sixteenth storage counting signals SC<1:16> as first to sixteenth pre-internal counting signals P_IC<1:16>. The flip-flop 313 may generate the first to sixteenth pre-internal counting signals P_IC<1:16> in which all bits are initialized at a logic "low" level when a refresh command REF is enabled at a logic "high" level. The counter 314 may up-count the first to sixteenth pre-internal counting signals P_IC<1:16> once to generate first to sixteenth internal counting signals IC<1:16>. The counter 314 may generate the first to sixteenth internal counting signals IC<1:16> in which all bits are initialized at a logic "low" level when the refresh command REF is enabled at a logic "high" level.

The counting signal output circuit 320 may be implemented with an AND gate 321 and a flip flop 322. The AND gate 321 may generate a write latch control signal WLC that is enabled at a logic "high" level when an internal write signal IWT and a first active signal RACT<1> are enabled at a lotic "high" level. The flip flop 322 may latch first to sixteenth internal counting signals IC<1:16> when the write latch control signal WLC is enabled at a logic "high" level, and may output the latched first to sixteenth internal counting signals IC<1:16> as the first to sixteenth storage counting signals SC<1:16>. The flip flop 322 may latch the first to sixteenth internal counting signals IC<1:16> when the write latch control signal WLC is enabled at a logic "high" level, and may output the latched first to sixteenth internal counting signals IC<1:16> as first to sixteenth counting signals CNT<1:16>.

The comparison circuit 330 may compare the first to sixteenth storage counting signals SC<1:16> that are input from the counting signal output circuit 320 and first to sixteenth mode register signals MR<1:16> to generate the first hammering detection signal RHIT<1>. The comparison circuit 330 may generate the first hammering detection signal RHIT<1> that is enabled when the first to sixteenth storage counting signals SC<1:16> are counted as having a bit combination of the first to sixteenth mode register signals MR<1:16> or higher. The first to sixteenth mode register signals MR<1:16> may include information on a set number. For example, when the number of input times of the active signal is set to eight, the first to sixteenth mode register signals MR<1:16> may be set to have a logic level combination that is the same as the logic level combination the first to sixteenth storage counting signals SC<1:16> that are up-counted eight times. The number of bits and the logic level combination of the first to sixteenth mode register signals MR<1:16> that include the information on the set number may be variously set according to embodiments.

Figure 6:
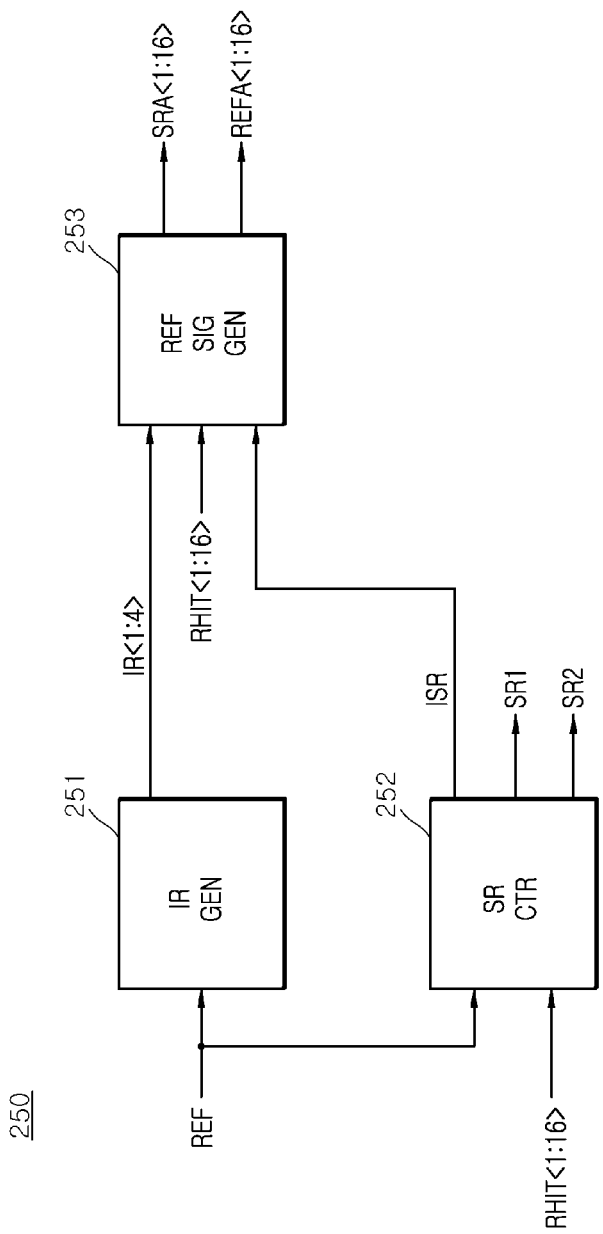
FIG. 6 is a block diagram illustrating a configuration according to an embodiment of a refresh control circuit included in the semiconductor device illustrated FIG. 2.

FIG. 6 is a block diagram illustrating a configuration according to an embodiment of the refresh control circuit 250 included in the semiconductor device 20 of FIG. 2. Referring to FIG. 6, the refresh control circuit 250 may include an internal refresh signal generating circuit 251, a smart refresh control circuit 252, and a refresh active signal generating circuit 253.

The internal refresh signal generating circuit 251 may generate first to fourth internal refresh signals IR<1:14> that are sequentially enabled when a refresh command REF is enabled. The internal refresh signal generating circuit 251 may generate the first internal refresh signal IR<1> that is generated for a predetermined period when the refresh command REF is enabled. The internal refresh signal generating circuit 251 may delay the first internal refresh signal IR<1> to generate the second internal refresh signal IR<2> that is generated for a predetermined period. The internal refresh signal generating circuit 251 may delay the second internal refresh signal IR<2> to generate the third internal refresh signal IR<3> that is generated for a predetermined period. The internal refresh signal generating circuit 251 may delay the third internal refresh signal IR<3> to generate the fourth internal refresh signal IR<4> that is generated for a predetermined period.

The smart refresh control circuit 252 may generate the first smart refresh signal SR1 and the second smart refresh signal SR2 that are sequentially enabled, based on first to sixteenth hammering detection signals RHIT<1:16> and the refresh command REF. The smart refresh control circuit 252 may generate the first smart refresh signal SR1 and the second smart refresh signal SR2 that are sequentially enabled, based on the refresh command REF when one of the first to sixteenth hammering detection signals RHIT<1:16> is enabled. The smart refresh control circuit 252 may generate an internal smart refresh signal ISR, based on the first smart refresh signal SR1 and the second smart refresh signal SR2. The smart refresh control circuit 252 may generate the internal smart refresh signal ISR that is enabled when one of the first smart refresh signal SR1 and the second smart refresh signal SR2 is enabled.

The refresh active signal generating circuit 253 may generate first to sixteenth smart refresh active signals SRA<1:16> and first to sixteenth refresh active signals REFA<1:16>, based on the first to fourth internal refresh signals IR<1:4>, the internal smart refresh signal ISR, and the first to sixteenth hammering detection signals RHIT<1:16>. The refresh active signal generating circuit 253 may generate the first to sixteenth smart refresh active signals SRA<1:16> or the first to sixteenth refresh active signals REFA<1:16>, based on the first to sixteenth hammering detection signals RHIT<1:16> when the first to fourth internal refresh signals IR<1:4> and the internal smart refresh signal ISR are enabled. The refresh active signal generating circuit 253 may generate the first to fourth smart refresh active signals SRA<1:4> or the first to fourth refresh active signals REFA<1:4>, based on the first to fourth hammering detection signals RHIT<1:4> when the first internal refresh signal IR<1> and the internal smart refresh signal ISR are enabled. The refresh active signal generating circuit 253 may generate the fifth to eighth smart refresh active signals SRA<5:8> or the fifth to eighth refresh active signals REFA<5:8>, based on the fifth to eighth hammering detection signals RHIT<5:8> when the second internal refresh signal IR<2> and the internal smart refresh signal ISR are enabled. The refresh active signal generating circuit 253 may generate the ninth to twelfth smart refresh active signals SRA<9:12> or the ninth to twelfth refresh active signals REFA<9:12>, based on the ninth to twelfth hammering detection signals RHIT<9:12> when the third internal refresh signal IR<3> and the internal smart refresh signal ISR are enabled. The refresh active signal generating circuit 253 may generate the thirteenth to sixteenth smart refresh active signals SRA<13:16> or the thirteenth to sixteenth refresh active signals REFA<13:16>, based on the thirteenth to sixteenth hammering detection signals RHIT<13:16> when the fourth internal refresh signal IR<4> and the internal smart refresh signal ISR are enabled.

Figure 7:
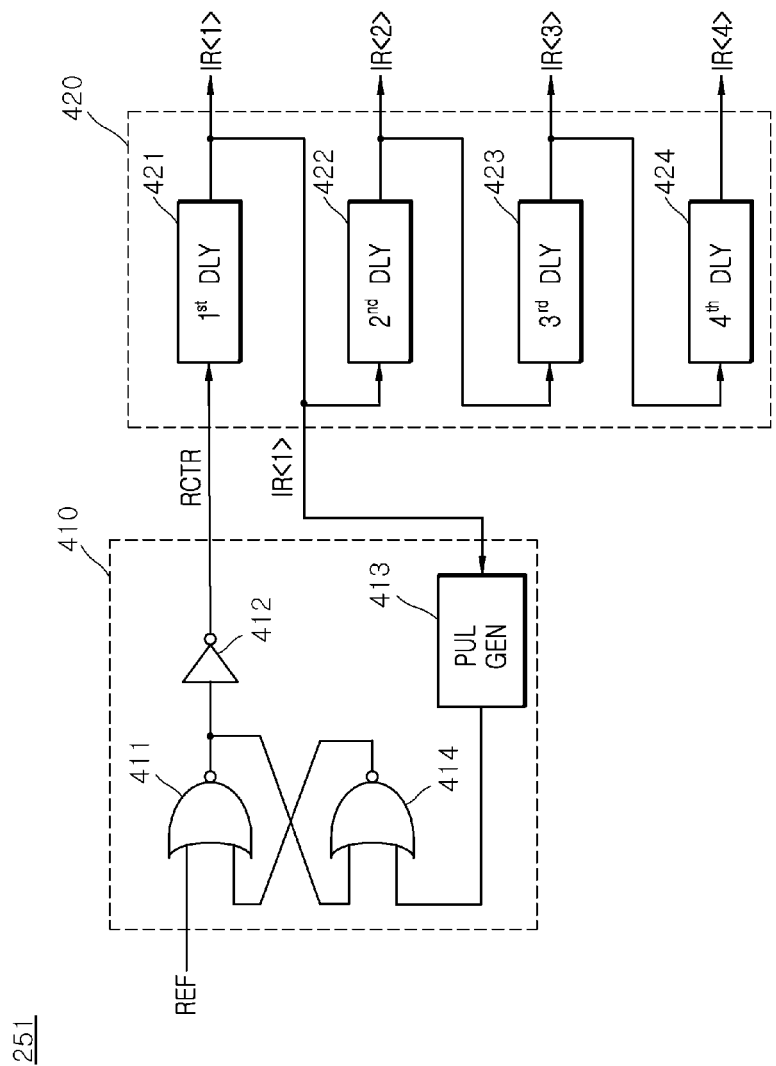
FIG. 7 is a diagram illustrating a configuration according to an embodiment of an internal refresh signal generating circuit included in the refresh control circuit illustrated in FIG. 6.

FIG. 7 is a diagram illustrating a configuration according to an embodiment of the internal refresh signal generating circuit 251 included in the refresh control circuit 250 illustrated in FIG. 6. As shown in FIG. 7, the internal refresh signal generating circuit 251 may include a refresh control signal generating circuit 410 and a delay circuit 420.

The refresh control signal generating circuit 410 may be implemented with NOR gates 411 and 414, an inverter 412, and a pulse generator 413. The refresh control signal generating circuit 410 may generate a refresh control signal RCTR that includes pulses generated for a predetermined period when a refresh command REF is enabled at a logic "high" level. The refresh control signal generating circuit 410 may generate the refresh control signal RCTR of a logic "high" level when the refresh command REF is enabled at a logic "high" level. The refresh control signal generating circuit 410 may generate the refresh control signal RCTR of a logic "low" level when the first internal refresh signal IS<1> is enabled at a logic "high" level.

The delay circuit 420 may include a first delay circuit 421, a second delay circuit 422, a third delay circuit 423, and a fourth delay circuit 424. The first delay circuit 421 may delay the refresh control signal RCTR to generate the first internal refresh signal IR<1>. The second delay circuit 422 may delay the first internal refresh signal IR<1> to generate the second internal refresh signal IR<2>. The third delay circuit 423 may delay the second internal refresh signal IR<2> to generate the third internal refresh signal IR<3>. The fourth delay circuit 424 may delay the third internal refresh signal IR<3> to generate the fourth internal refresh signal IR<4>. The delay circuit 420 may delay the refresh control signal RCTR to generate the first to fourth internal refresh signals IR<1:4> that are generated sequentially.

Figure 8:
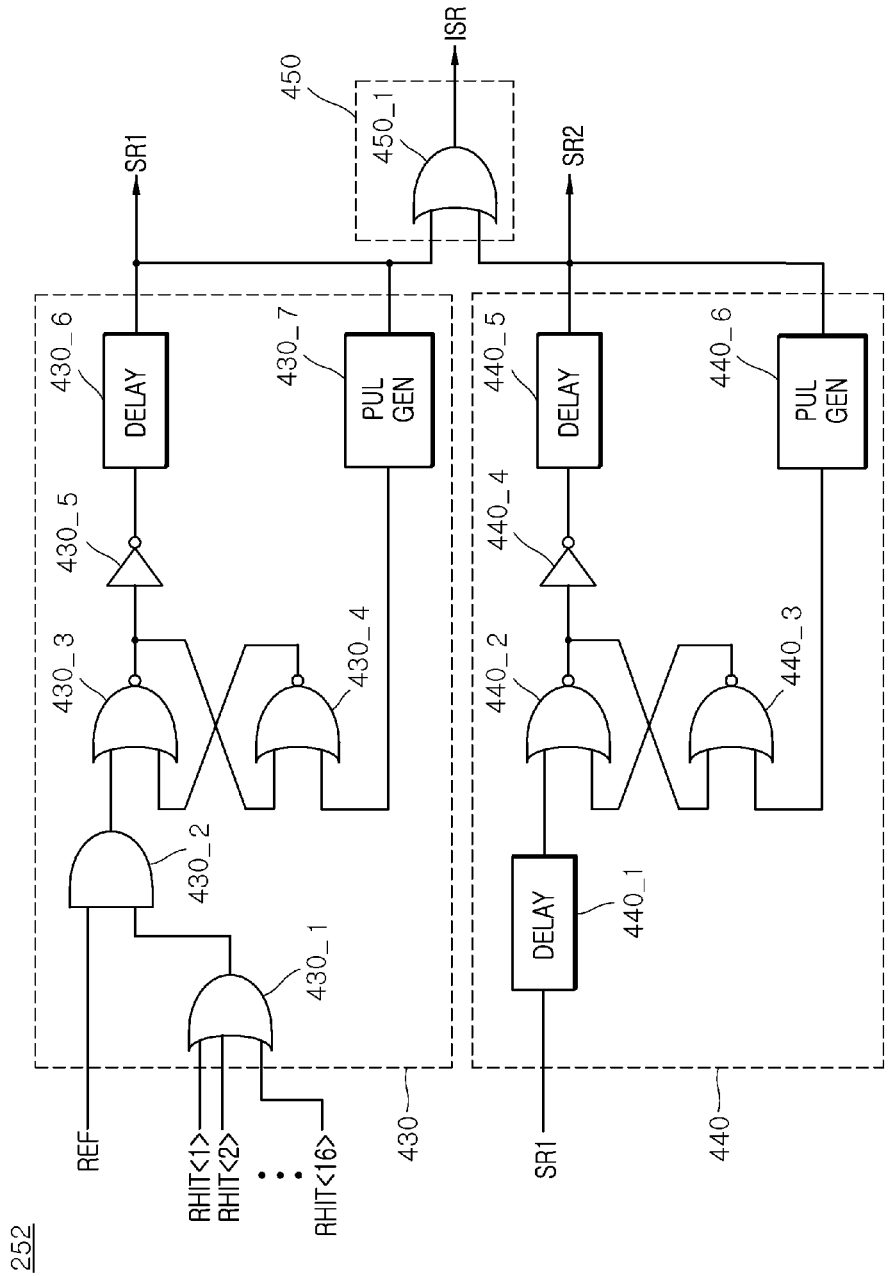
FIG. 8 is a diagram illustrating a configuration according to an embodiment of a smart refresh control circuit included in the refresh control circuit illustrated in FIG. 6.

FIG. 8 is a diagram illustrating a configuration according to an embodiment of the smart refresh control circuit 252 included in the refresh control circuit 250 illustrated in FIG. 6. As shown in FIG. 8, the smart refresh control circuit 252 may include a first smart refresh control signal generating circuit 430, a second smart refresh control signal generating circuit 440, and an internal smart refresh signal generating circuit 450.

The first smart refresh control signal generating circuit 430 may be implemented with an OR gate 430_1, an AND gate 430_2, NOR gates 430_3 and 430_4, an inverter 430_5, a delay circuit 430_6, and a pulse generator 430_7. The first smart refresh control signal generating circuit 430 may generate a first smart refresh signal SR1, based on first to sixteenth hammering detection signals RHIT<1:16> and a refresh command REF. The first smart refresh control signal generating circuit 430 may generate the first smart refresh signal SR1 that includes pulses generated for a predetermined period when one of the first to sixteenth hammering detection signals RHIT<1:16> is enabled at a logic "high" level and the refresh command REF is enabled at a logic "high" level.

The second smart refresh control signal generating circuit 440 may be implemented with delay circuits 440_1 and 440_5, NOR gates 440_2 and 440_3, an inverter 440_4, and a pulse generator 440_6. The second smart refresh control signal generating circuit 440 may delay the first smart refresh signal SR1 to generate a second smart refresh signal SR2 that includes pulses generated for a predetermined period. The second smart refresh control signal generating circuit 440 may generate the second smart refresh signal SR2 that includes the pulses generated for a predetermined period after the first smart refresh signal SR1 is enabled at a logic "high" level.

The internal smart refresh signal generating circuit 450 may be implemented with an OR gate 450_1. The internal smart refresh signal generating circuit 450 may synthesize the first smart refresh signal SR1 and the second smart refresh signal SR2 to generate an internal smart refresh signal ISR. The internal smart refresh signal generating circuit 450 may generate the internal smart refresh signal ISR that is enabled at a logic "high" level when one of the first smart refresh signal SR1 and the second smart refresh signal SR2 is enabled at a logic "high" level.

Figure 9:
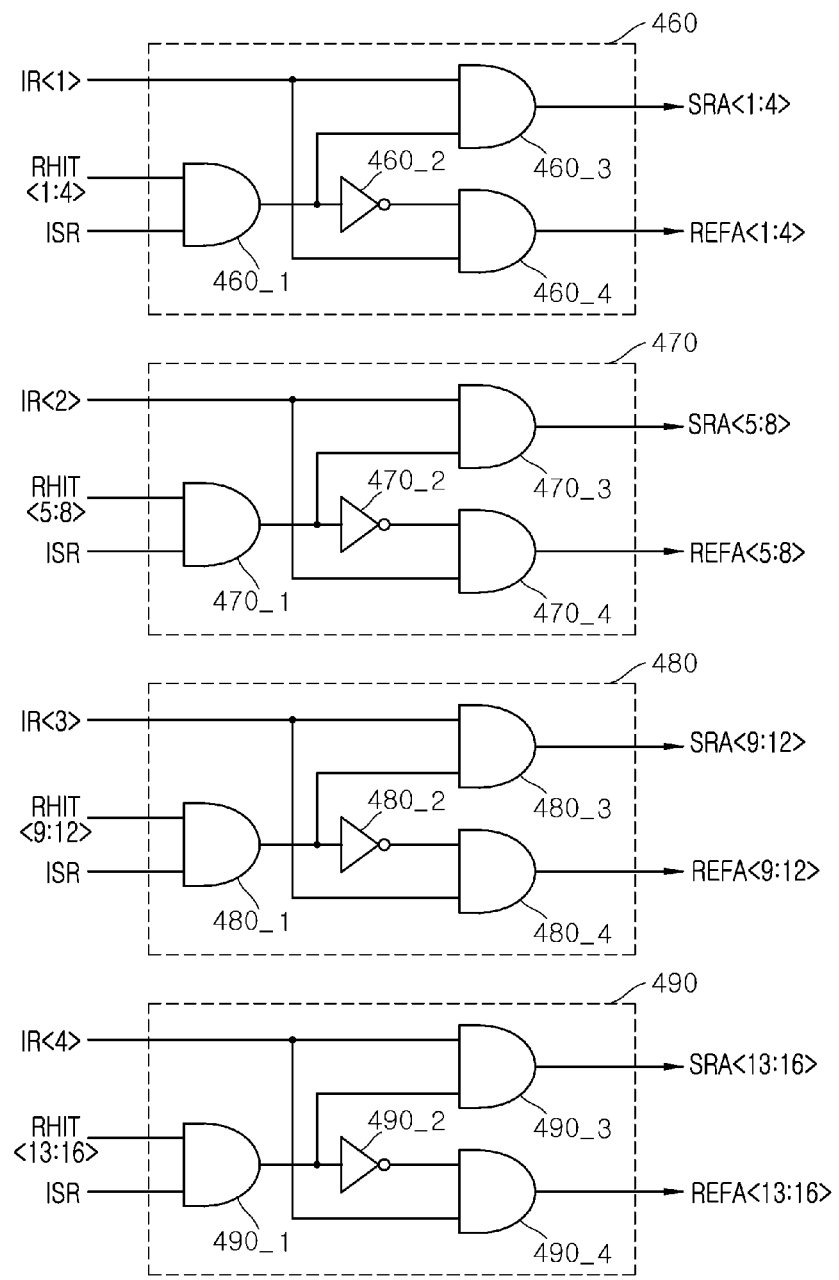
FIG. 9 is a circuit diagram illustrating a configuration according to an embodiment of a refresh active signal generating circuit included in the refresh control circuit illustrated in FIG. 6.

FIG. 9 is a circuit diagram illustrating a configuration according to an embodiment of the refresh active signal generating circuit 253 included in the refresh control circuit 250 illustrated in FIG. 6. As shown in FIG. 9, the refresh active signal generating circuit 253 may include first to fourth logic circuits 460-490.

The first logic circuit 460 may be implemented with AND gates 460_1, 460_3, and 460_4, and an inverter 460_2. The first logic circuit 460 may generate first to fourth smart refresh active signals SRA<1:4> or first to fourth refresh active signals REFA<1:4>, based on a first internal refresh signal IR<1>, an internal smart refresh signal ISR, and first to fourth hammering detection signals RHIT<1:4>. The first logic circuit 460 may generate the first to fourth smart refresh active signals SRA<1:4> or the first to fourth refresh active signals REFA<1:4> according to the logic levels of the first to fourth hammering detection signals RHIT<1:4> when the first internal refresh signal IR<1> is enabled at a logic "high" level and the internal smart refresh signal ISR is enabled at a logic "high" level. For example, for the first logic circuit 460, in a case in which the first hammering detection signal RHIT<1> is enabled at a logic "high" level when the first internal refresh signal IR<1> is enabled at a logic "high" level and the internal smart refresh signal ISR is enabled at a logic "high" level, the first smart refresh active signal SRA<1> may be enabled at a logic "high" level, and the second to fourth smart refresh active signals SRA<2:4> may be disabled at a logic "low" level. In the first logic circuit 460. For the first logic circuit 460, in a case in which the first hammering detection signal RHIT<1> is enabled at a logic "high" level when the first internal refresh signal IR<1> is enabled at a logic "high" level and the internal smart refresh signal ISR is enabled at a logic "high" level, the first refresh active signal REFA<1> may be disabled at a logic "low" level and the second to fourth refresh active signals REFA<2:4> may be enabled at a logic "high" level. Although the first logic circuit 460 is illustrated as a single circuit, the first logic circuit 460 may be implemented with four circuits that correspond to the number of bits of the first to fourth hammering detection signals RHIT<1:4>.

The second logic circuit 470 may be implemented with AND gates 470_1, 470_3, and 470_4, and an inverter 470_2. The second logic circuit 470 may generate the fifth to eighth smart refresh active signals SRA<5:8> or the fifth to eighth refresh active signals REFA<5:8>, based on the second internal refresh signal IR<2>, the internal smart refresh signal ISR, and the fifth to eighth hammering detection signals RHIT<5:8>. The second logic circuit 470 may generate the fifth to eighth smart refresh active signals SRA<5:8> or the fifth to eighth refresh active signals REFA<5:8> according to the logic levels of the fifth to eighth hammering detection signals RHIT<5:8> when the second internal refresh signal IR<2> is enabled at a logic "high" level and the internal smart refresh signal ISR is enabled at a logic "high" level. Because the second logic circuit 470 may execute the same operation only different from the first logic circuit 460 in input/output signals, a detailed description thereof will be omitted. Although the second logic circuit 470 is illustrated as a single circuit, the second logic circuit 470 may be implemented with four circuits that correspond to the number of bits of the fifth to twelfth hammering detection signals RHIT<5:8>.

The third logic circuit 480 may be implemented with AND gates 480_1, 480_3, and 480_4, and an inverter 480_2. The third logic circuit 480 may generate the ninth to twelfth smart refresh active signals SRA<9:12> or the ninth to twelfth refresh active signals REFA<9:12>, based on the third internal refresh signal IR<3>, the internal smart refresh signal ISR, and the ninth to twelfth hammering detection signals RHIT<9:12>. The third logic circuit 480 may generate the ninth to twelfth smart refresh active signals SRA<9:12> or the ninth to twelfth refresh active signals REFA<9:12> according to the logic levels of the ninth to twelfth hammering detection signals RHIT<9:12> when the third internal refresh signal IR<3> is enabled at a logic "high" level and the internal smart refresh signal ISR is enabled at a logic "high" level. Because the third logic circuit 480 may execute the same operation only different from the first logic circuit 460 in input/output signals, a detailed description thereof will be omitted. Although the third logic circuit 480 is illustrated as a single circuit, the third logic circuit 480 may be implemented with four circuits that correspond to the number of bits of the ninth to twelfth hammering detection signals RHIT<9:12>.

The fourth logic circuit 490 may be implemented with AND gates 490_1, 490_3, and 490_4, and an inverter 490_2. The fourth logic circuit 490 may generate the thirteenth to sixteenth smart refresh active signals SRA<13:16> or the thirteenth to sixteenth refresh active signals REFA<13:16>, based on the fourth internal refresh signal IR<4>, the internal smart refresh signal ISR, and the thirteenth to sixteenth hammering detection signals RHIT<13:16>. The fourth logic circuit 490 may generate the thirteenth to sixteenth smart refresh active signals SRA<13:16> or the thirteenth to sixteenth refresh active signals REFA<13:16> according to the logic levels of the thirteenth to sixteenth hammering detection signals RHIT<13:16> when the fourth internal refresh signal IR<4> is enabled at a logic "high" level and the internal smart refresh signal ISR is enabled at a logic "high" level. Because the fourth logic circuit 490 may execute the same operation only different from the first logic circuit 460 in input/output signals, a detailed description thereof will be omitted. Although the fourth logic circuit 490 is illustrated as a single circuit, the fourth logic circuit 490 may be implemented with four circuits that correspond to the number of bits of the thirteenth to sixteenth hammering detection signals RHIT<13:16>.

Figure 10:
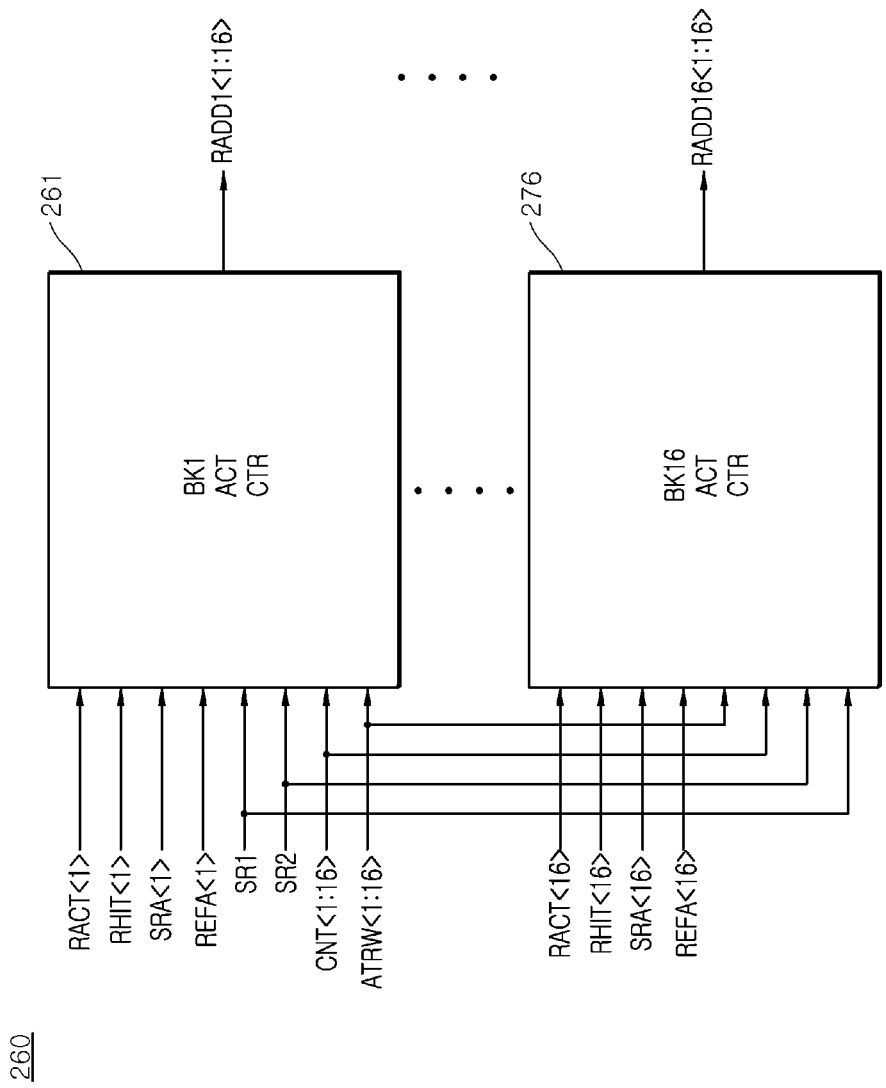
FIG. 10 is a block diagram illustrating a configuration according to an embodiment of an active control circuit included in the semiconductor device illustrated in FIG. 2.

FIG. 10 is a block diagram illustrating a configuration according to an embodiment of the active control circuit 260 included in the semiconductor device 20 of FIG. 2. As shown in FIG. 10, the active control circuit 260 may include first to sixteenth active control circuits 261-276.

The first active control circuit 261 may generate an internal address RADD1<1:16> for the first bank BK1, based on a first active signal RACT<1>, a first hammering detection signal RHIT<1>, a first smart refresh active signal SRA<1>, a first refresh active signal REFA<1>, a first smart refresh signal SR1, a second smart refresh signal SR2, first to sixteenth counting signals CNT<1:16>, and first to sixteenth active addresses ATRW<1:16>. The first active control circuit 261 may store the first to sixteenth active addresses ATRW<1:16> as target addresses (TG_ADD<1:16> of FIG. 11) when the first active signal RACT<1> and the first hammering detection signal RHIT<1> are enabled, and the first to sixteenth counting signals CNT<1:16> are counted as maximum values. The first active control circuit 261 may execute an addition operation on the target addresses (TG_ADD<1:16> of FIG. 11) to generate the internal address RADD1<1:16> for the first bank BK1 when the first smart refresh active signal SRA<1> is enabled and the first smart refresh signal SR1 is enabled. The first active control circuit 261 may execute a subtraction operation on the target addresses (TG_ADD<1:16> in FIG. 11) to generate the internal address RADD1<1:16> for the first bank BK1 when the first smart refresh active signal SRA<1> is enabled and the second smart refresh signal SR2 is enabled. The first active control circuit 261 may generate the internal address RADD1<1:16> for the first bank BK1, which is sequentially counted when the first refresh active signal REFA<1> is enabled. The first active control circuit 261 may generate the internal address RADD1<1:16> for the first bank BK1 from the first to sixteenth active addresses ATRW<1:16> when the first refresh active signal REFA<1> is disabled in a write operation and a read operation.

Because the second to sixteenth active control circuits 262-276 may be implemented with the same circuits and may execute the same operations except for input/output signals different from the first active control circuit, a detailed description thereof will be omitted.

Figure 11:
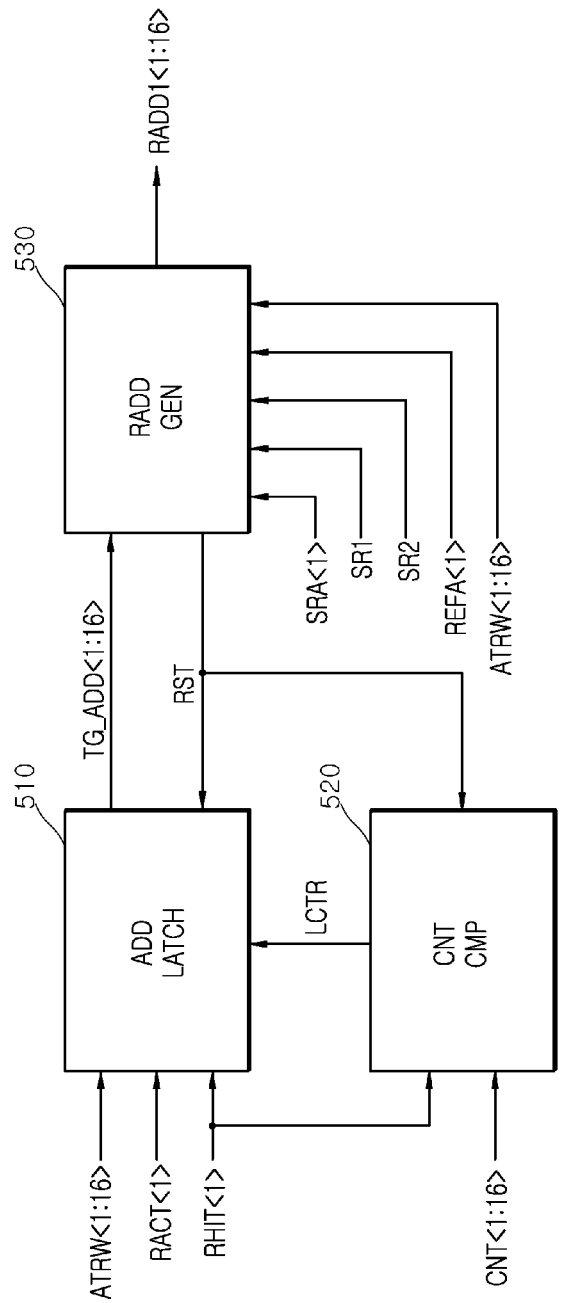
FIG. 11 is a block diagram illustrating a configuration according to an embodiment of a first active control circuit included in the active control circuit illustrated in FIG. 10.

FIG. 11 is a block diagram illustrating a configuration according to an embodiment of the first active control circuit 261 included in the active control circuit 260 illustrated in FIG. 10. As shown in FIG. 11, the first active control circuit 261 may include an address latch circuit 510, a counting comparison circuit 520, and an internal address generating circuit 530.

The address latch circuit 510 may store first to sixteenth active addresses ATRW<1:16> as target addresses TG_ADD<1:16> when a first active signal RACT<1>, a first hammering detection signal RHIT<1>, and a latch control signal LCTR are enabled. The address latch circuit 510 may initialize the target addresses TG_ADD<1:16> when a reset signal RST is enabled.

The counting comparison circuit 520 may generate the latch control signal LCTR that is enabled when the first hammering detection signal RHIT<1> is enabled and the first to sixteenth counting signals CNT<1:16> are counted to the maximum value. The counting comparison circuit 520 may store the first to sixteenth counting signals CNT<1:16> that are counted to the maximum value. The counting comparison circuit 520 may initialize the first to sixteenth counting signals CNT<1:16> that are counted to the maximum value.

The internal address generating circuit 530 may execute an addition operation on the first to sixteenth target addresses TG_ADD<1:16> to generate an internal address RADD1<1:16> for the first bank BK1 when the first smart refresh active signal SRA<1> is enabled and the first smart refresh signal SR1 is enabled. The internal address generating circuit 530 may execute a subtraction operation on the first to sixteenth target addresses TG_ADD<1:16> to generate the internal address RADD1<1:16> for the first bank BK1 when the first smart refresh active signal SRA<1> is enabled and the second smart refresh signal SR2 is enabled. The internal address generating circuit 530 may generate the internal address RADD1<1:16> for the first bank BK1 that are sequentially counted when the first refresh active signal REFA<1> is enabled. The internal address generating circuit 530 may generate the internal address RADD1<1:16> for the first bank BK1 from the first to sixteenth active addresses ATRW<1:16> when the first refresh active signal REFA<1> is disabled in the write operation and the read operation. The internal address generating circuit 530 may generate a reset signal RST that is enabled for a predetermined period after the second smart refresh signal SR2 is enabled.

Figure 12:
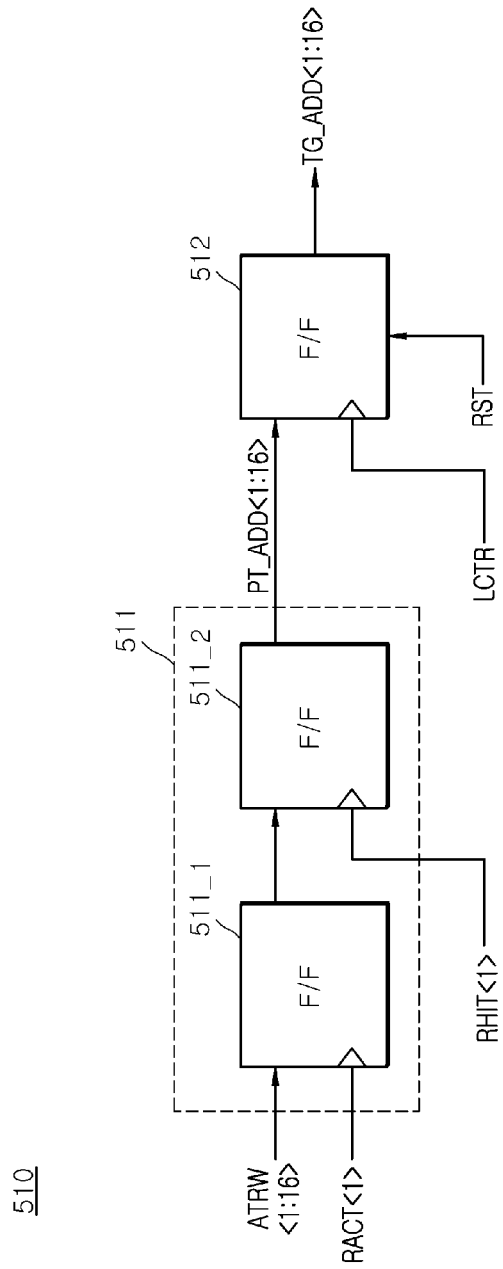
FIG. 12 is a block diagram illustrating a configuration according to an embodiment of an address latch circuit included in the first active control circuit illustrated in FIG. 11.

FIG. 12 is a block diagram illustrating a configuration according to an embodiment of the address latch circuit 510 included in the first active control circuit 261 illustrated in FIG. 11. As shown in FIG. 12, the address latch circuit 510 may include a pre-target address generating circuit 511 and a target address generating circuit 512.

The pre-target address generating circuit 511 may be implemented with flip flops 511_1 and 511_2. The flip flop 511_1 may latch and output first to sixteenth active addresses ATRW<1:16> when a first active signal RACT<1> is enabled at a logic "high" level. The flip flop 511_2 may latch the first to sixteenth active addresses ATRW<1:16> that are latched in the flip flop 511_1 to output the latched first to sixteenth active addresses ATRW<1:16> as first to sixteenth pre-target addresses PT_ADD<1:16> when a first hammering detection signal RHIT<1> is enabled at a logic "high" level. The pre-target address generating circuit 511 may latch the first to sixteenth active addresses ATRW<1:16> to generate the first to sixteenth pre-target addresses PT_ADD<1:16> when the first active signal RACT<1> and the first hammering detection signal RHIT<1> are enabled at a logic "high" level.

The pre-target address generating circuit 512 may latch the first to sixteenth pre-target addresses PT_ADD<1:16> to generate first to sixteenth target addresses TG_ADD<1:16> when a latch control signal LCTR is enabled at a logic "high" level. The pre-target address generating circuit 511 may initialize the first to sixteenth target addresses TG_ADD<1:16> when a reset signal RST is enabled at a logic "high" level.

Figure 13:
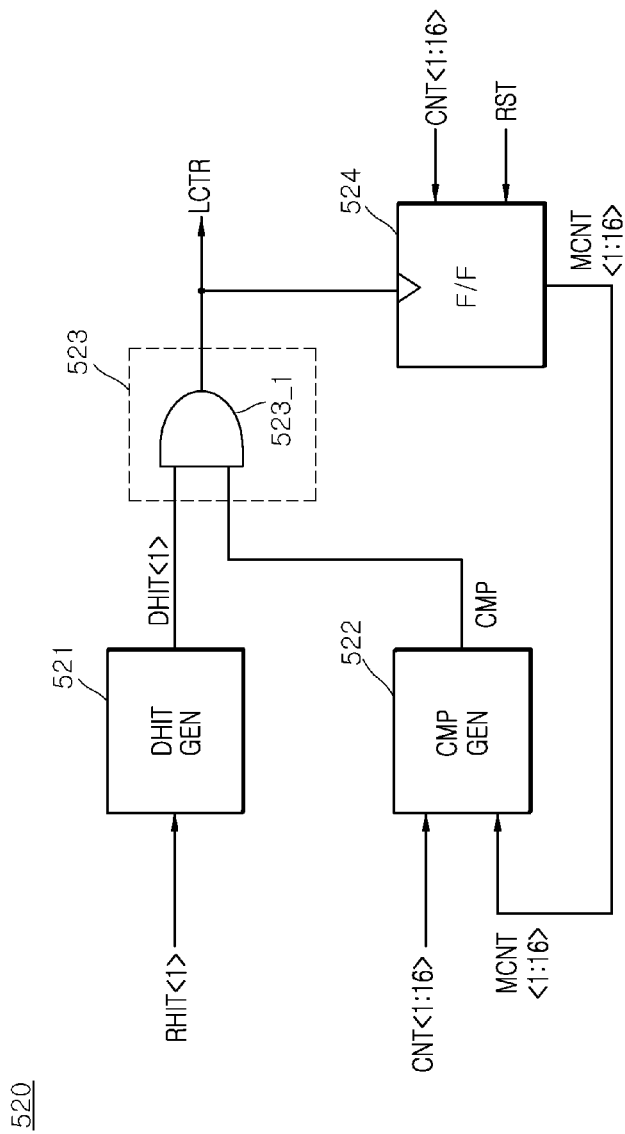
FIG. 13 is a diagram illustrating a configuration according to an embodiment of a counting comparison circuit included in the first active control circuit illustrated in FIG. 11.

FIG. 13 is a diagram illustrating a configuration according to an embodiment of the counting comparison circuit 520 included in the first active control circuit 261 illustrated in FIG. 11. As shown in FIG. 13, the counting comparison circuit 520 may include a delay hammering signal generating circuit 521, a comparison signal generating circuit 522, a latch control signal generating circuit 523, and a maximum counting signal generating circuit 524.

The delay hammering signal generating circuit 521 may delay the first hammering detection signal RHIT<1> to generate a first delay hammering signal DHIT<1>.

The comparison signal generating circuit 522 may compare first to sixteenth counting signals CNT<1:16> and first to sixteenth maximum counting signals MCNT<1:16> to generate a comparison signal CMP. The comparison signal generating circuit 522 may generate the comparison signal CMP that is enabled at a logic "high" level when the first to sixteenth counting signals CNT<1:16> are counted to the first to sixteenth maximum counting signals MCNT<1:16> or more.

The latch control signal generating circuit 523 may be implemented with an AND gate 523_1. The latch control signal generating circuit 523 may generate a latch control signal LCTR, based on the comparison signal CMP and the first delay hammering signal DHIT<1>. The latch control signal generating circuit 523 may generate the latch control signal LCTR that is enabled at a logic "high" level when the comparison signal CMP and the first delay hammering signal DHIT<1> are enabled at a logic "high" level.

The maximum counting signal generating circuit 524 may latch the first to sixteenth counting signals CNT<1:16> as the first to sixteenth maximum counting signals MCNT<1:16> when the latch control signal LCTR is enabled at a logic "high" level. The maximum counting signal generating circuit 524 may initialize the first to sixteenth maximum counting signals MCNT<1:16> when the reset signal RST is enabled at a logic "high" level.

Figure 14:
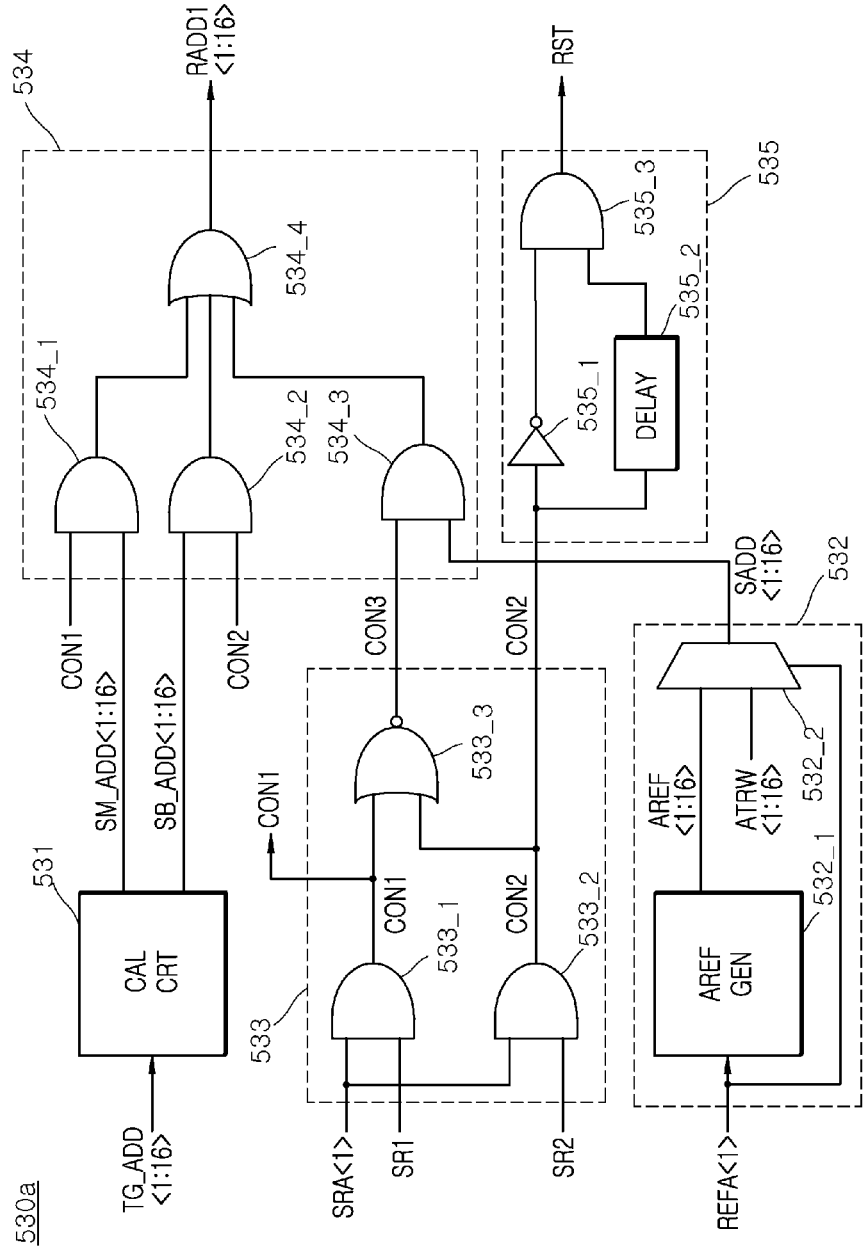
FIG. 14 is a diagram illustrating a configuration according to an embodiment of an internal address generating circuit included in the first active control circuit illustrated in FIG. 11.

FIG. 14 is a diagram illustrating a configuration according to an embodiment of the internal address generating circuit 530a included in the first active control circuit 261 illustrated in FIG. 11. As shown in FIG. 14, the internal address generating circuit 530a may include a calculating circuit 531, a selection address generating circuit 532, a control signal generating circuit 533, an internal address output circuit 534, and a reset signal generating circuit 535.

The calculating circuit 531 may execute an addition operation on first to sixteenth target addresses TG_ADD<1:16> to generate first to sixteenth addition addresses AM_ADD<1:16>. The calculating circuit 531 may up-count the first to sixteenth target addresses TG_ADD<1:16> once to generate first to sixteenth addition addresses SM_ADD<1:16>. The calculating circuit 531 may execute a subtraction operation on the first to sixteenth target addresses TG_ADD<1:16> to generate first to sixteenth subtraction addresses SB_ADD<1:16>. The calculating circuit 531 may down-count the first to sixteenth target addresses TG_ADD<1:16> once to generate the first to sixteenth subtraction addresses SB_ADD<1:16>.

The selection address generating circuit 532 may include a refresh address generating circuit 532_1 and a selection transfer circuit 532_2. The refresh address generating circuit 532_1 may generate first to sixteenth refresh addresses AREF<1:16> that are sequentially up-counted when a first refresh active signal REFA<1> is enabled at a logic "high" level. The selection transfer circuit 532_2 may output the first to sixteenth refresh addresses AREF<1:16> as first to sixteenth selection addresses SADD<1:16> when the first refresh active signal REFA<1> is enabled at a logic "high" level. The selection transfer circuit 532_2 may output first to sixteenth active addresses ATRW<1:16> as the first to sixteenth selection addresses SADD<1:16> when the first refresh active signal REFA<1> is disabled at a logic "low" level. The selection address generating circuit 532 may generate the first to sixteenth selection addresses SADD<1:16> that are sequentially up-counted when the first refresh active signal REFA<1> is enabled at a logic "high" level in a refresh operation. The selection address generating circuit 532 may generate the first to sixteenth selection addresses SADD<1:16> from the first to sixteenth active addresses ATRW<1:16> when the first refresh active signal REFA<1> is disabled at a logic "low" level in a write operation and a read operation.

The control signal generating circuit 533 may be implemented with AND gates 533_1 and 533_2, and a NOR gate 533_3. The control signal generating circuit 533 may generate a first control signal CON1 of a logic "high" level when a first smart refresh active signal SRA1 is enabled at a logic "high" level and a first smart refresh signal SR1 is enabled at a logic "high" level. The control signal generating circuit 533 may generate a second control signal CON2 of a logic "high" level when the first smart refresh active signal SRA1 is enabled at a logic "high" level and a second smart refresh signal SR2 is enabled at a logic "high" level. The control signal generating circuit 533 may generate a third control signal CON3 of a logic "high" level when the first smart refresh signal SR1 is disabled at a logic "low" level and the second smart refresh signal SR2 is disabled at a logic "low" level.

The internal address output circuit 534 may be implemented with AND gates 534_1, 534_2, and 534_3 and an OR gate 534_4. The internal address output circuit 534 may output the first to sixteenth addition addresses SM_ADD<1:16> as the internal address RADD1<1:16> for the first bank BK1 when the first control signal CON1 is enabled at a logic "high" level. The internal address output circuit 534 may output the first to sixteenth subtraction addresses SM_ADD<1:16> as the internal address RADD1<1:16> for the first bank BK1 when the second control signal CON2 is enabled at a logic "high" level. The internal address output circuit 534 may output the first to sixteenth selection addresses SADD<1:16> as the internal address RADD1<1:16> for the first bank BK1 when the third control signal CON3 is enabled at a logic "high" level.

The reset signal generating circuit 535 may be implemented with an inverter 535_1, a delay circuit 535_2, and an AND gate 535_3. The reset signal generating circuit 535 may generate a reset signal RST that is enabled at a logic "high" level when the second control signal CON2 is enabled at a logic "high" level and then disabled at a logic "low" level.

Figure 15:
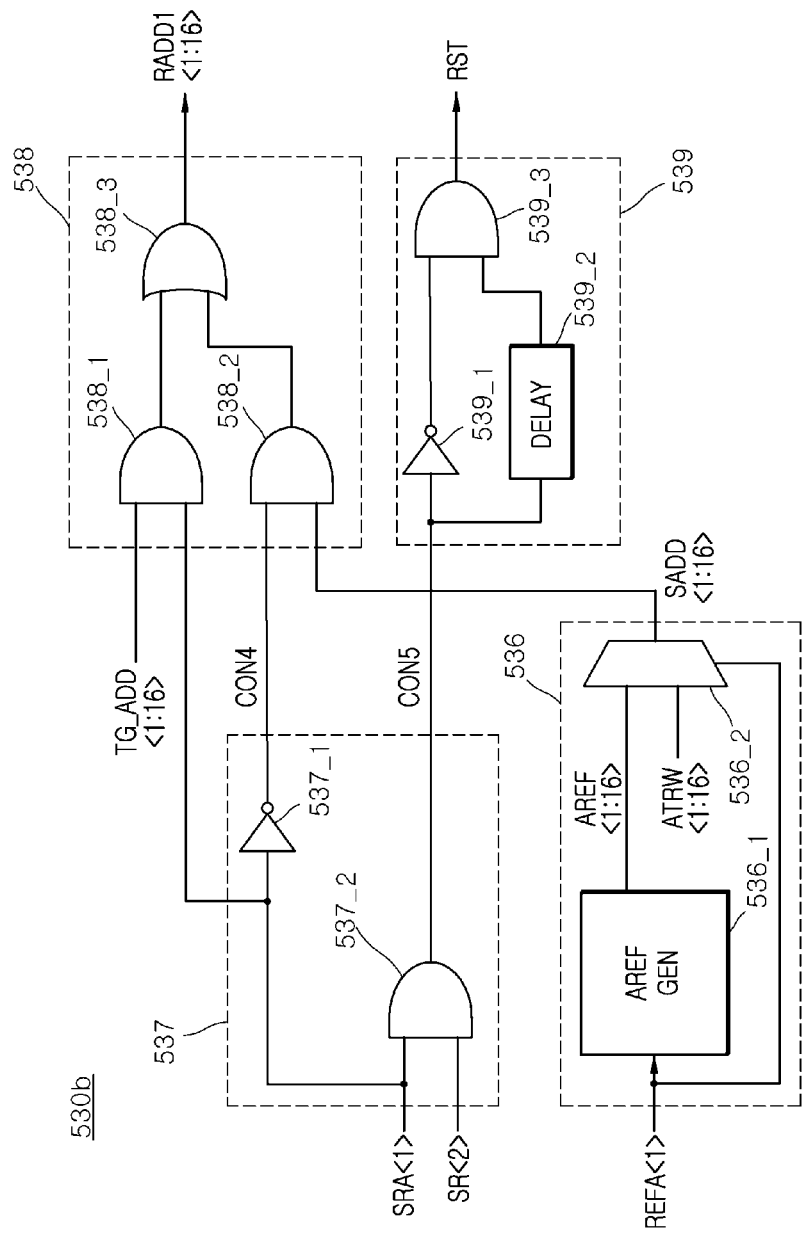
FIG. 15 is a diagram illustrating a configuration according to another embodiment of the internal address generating circuit included in the first active control circuit illustrated in FIG. 11.

FIG. 15 is a diagram illustrating a configuration according to another embodiment of the internal address generating circuit 530b included in the first active control circuit 261 illustrated in FIG. 11. As shown in FIG. 15, the internal address generating circuit 530b may include a selection address generating circuit 536, a control signal generating circuit 537, an internal address output circuit 538, and a reset signal generating circuit 539.

The selection address generating circuit 536 may include a refresh address generating circuit 536_1 and a selection transfer circuit 536_2. The refresh address generating circuit 536_1 may generate first to sixteenth refresh addresses AREF<1:16> that are sequentially up-counted when a first refresh active signal REFA<1> is enabled at a logic "high" level. The selection transfer circuit 536_2 may output the first to sixteenth refresh addresses AREF<1:16> as first to sixteenth selection addresses SADD<1:16> when the first refresh active signal REFA<1> is enabled at a logic "high" level. The selection transfer circuit 536_2 may output first to sixteenth active addresses ATRW<1:16> as the first to sixteenth selection addresses SADD<1:16> when the first refresh active signal REFA<1> is disabled at a logic "low" level. The selection address generating circuit 536 may generate the first to sixteenth selection addresses SADD<1:16> that are sequentially up-counted when the first refresh active signal REFA<1> is enabled at a logic "high" level in a refresh operation. The selection address generating circuit 536 may generate the first to sixteenth selection addresses SADD<1:16> from the first to sixteenth active addresses ATRW<1:16> when the first refresh active signal REFA<1> is disabled at a logic "low" level in a write operation and a read operation.

The control signal generating circuit 537 may be implemented with an inverter 537_1 and an AND gate 537_2. The control signal generating circuit 537 may generate a fourth control signal CON4 of a logic "high" level when the first smart refresh active signal SRA<1> is disabled at a logic "low" level. The control signal generating circuit 537 may generate a fifth control signal CON5 of a logic "high" level when the first smart refresh active signal SRA<1> is enabled at a logic "high" level and the second smart refresh signal SR2 is enabled at a logic "high" level.

The internal address output circuit 538 may be implemented with AND gates 538_1 and 538_2 and an OR gate 538_3. The internal address output circuit 538 may output first to sixteenth target addresses TG_ADD<1:16> as the internal addresses RADD1<1:16> for the first bank BK1 when the first smart refresh active signal SRA<1> is enabled at a logic "high" level. The internal address output circuit 538 may output the first to sixteenth target addresses TG_ADD<1:16> as the internal addresses RADD1<1:16> for the first bank BK1 when the fourth control signal CON4 is enabled at a logic "high" level.

The reset signal generating circuit 539 may be implemented with an inverter 539_1, a delay circuit 539_2, and an AND gate 539_3. The reset signal generating circuit 539 may generate a reset signal RST that is enabled at a logic "high" level when the fifth control signal CON5 is enabled at a logic "high" level and then disabled at a logic "low" level.

Meanwhile, another embodiment of the internal address generating circuit 530b shown in FIG. 15 might not include the calculation circuit (531 of FIG. 14) and might not execute addition and subtraction operations on the first to sixteenth target addresses TG_ADD<1:16>, but may be provided with the calculation circuit (531 of FIG. 14) in the memory circuit (240 of FIG. 2) to execute the addition and subtraction operations on the first to sixteenth target addresses TG_ADD<1:16>, thereby executing a smart refresh operation.

Figure 16:
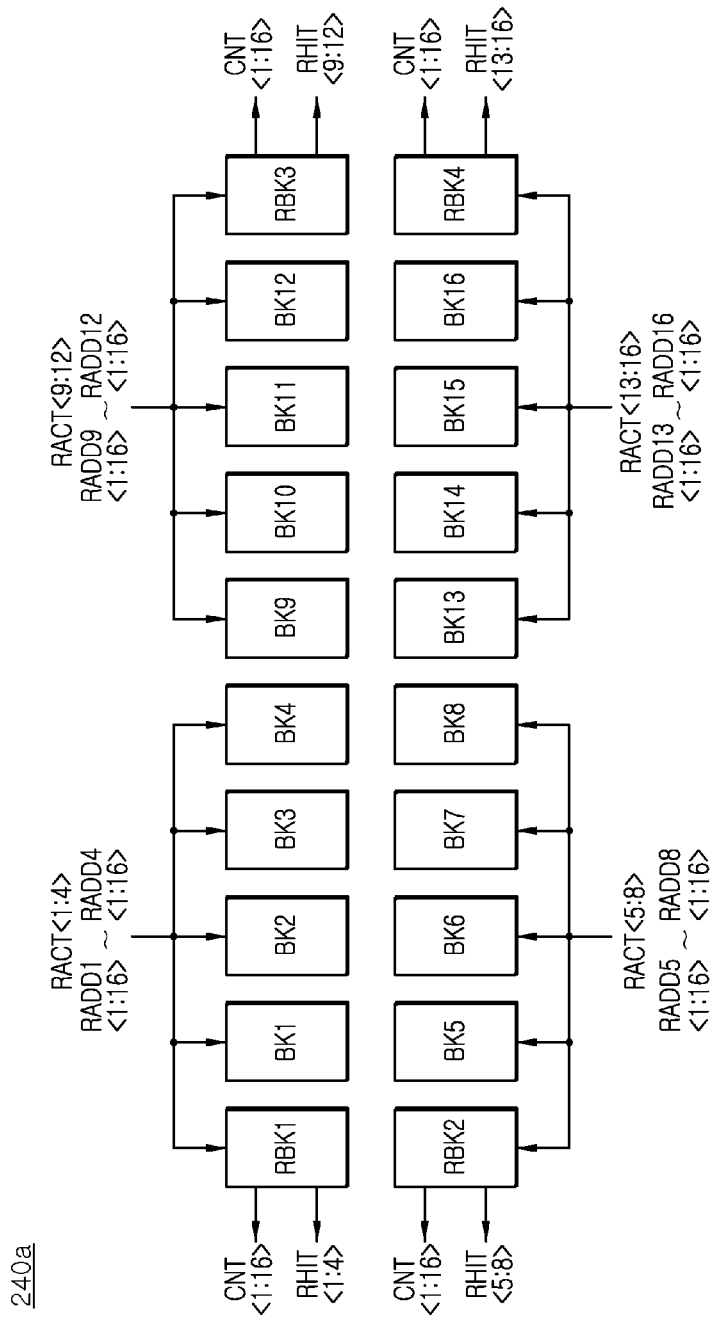
FIG. 16 is a block diagram illustrating a configuration according to another embodiment of a memory circuit included in the semiconductor device illustrated in FIG. 2.

FIG. 16 is a block diagram illustrating a configuration according to another embodiment of a memory circuit 240a included in the semiconductor device 20 illustrated in FIG. 2. As shown in FIG. 16, the memory circuit 240a may include first to sixteenth banks BK1-BK16 and first to fourth row hammering banks RBK1-RBK4.

The first to sixteenth banks BK1-BK16 may execute a refresh operation and a smart refresh operation on the bank that is selected by first to sixteenth active signals RACT<1:16> and a plurality of internal addresses RADD1<1:16>-RADD16<1:16> in a refresh operation. The first to sixteenth banks BK1-BK16 may execute the refresh operation on the bank in which an enabled hammering detection signal is not generated among the first to sixteenth hammering detection signals RHIT<1:16> by the first to sixteenth active signals RACT<1:16> and a plurality of internal addresses RADD1<1:16>-RADD16<1:16> in the refresh operation. The first to sixteenth banks BK1-BK16 may execute a smart refresh operation on the bank in which an enabled hammering detection signal is generated among the first to sixteenth hammering detection signals RHIT<1:16> by the first to sixteenth active signals RACT<1:16> and the plurality of internal addresses RADD1<1:16>-RADD16<1:16> in the refresh operation.

The first to sixteenth banks BK1-BK16 may store data DATA in the bank that is selected by the first to sixteenth active signals RACT<1:16> and the plurality of internal addresses RADD1<1:16>-RADD16<1:16> in a write operation. The first to sixteenth banks BK1-BK16 may output the data DATA stored in the bank that is selected by the first to sixteenth active signals RACT<1:16> and the plurality of internal addresses RADD1<1:16>-RADD16<1:16> in the write operation. Each of the first to sixteenth banks BK1-BK16 may be implemented to include the internal control circuit 241_1, the memory cell array 241_2, and the data input/output circuit 241_5 shown in FIG. 4.

The first row hammering bank RBK1 may count the number of input times of the first to fourth active signals RACT<1:4> for the first to fourth banks BK1-BK4 to generate first to sixteenth counting signals CNT<1:16>. The first row hammering bank RBK1 may generate the first to fourth hammering detection signals RHIT<1:4> when the number of input times of the first to fourth active signals RACT<1:4> is greater than or equal to a set number of times. The first row hammering bank RBK1 may be implemented to include the row hammering storage circuit 241_3 and the row hammering control circuit 241_4 shown in FIG. 4.

The second row hammering bank RBK2 may count the number of input times of the first to fourth active signals RACT<1:4> for the fifth to eighth banks BK5-BK8 to generate the first to sixteenth counting signals CNT<1:16>. The second row hammering bank RBK2 may generate the fifth to eighth hammering detection signals RHIT<5:8> when the number of input times of the fifth to eighth active signals RACT<5:8> is greater than or equal to the set number of times. The second row hammering bank RBK2 may be implemented to include the row hammering storage circuit 241_3 and the row hammering control circuit 241_4 shown in FIG. 4.

The third row hammering bank RBK3 may count the number of input times of the ninth to twelfth active signals RACT<9:12> for the ninth to twelfth banks BK9-BK12 to generate the first to sixteenth counting signals CNT<1:16>. The third row hammering bank RBK3 may generate the ninth to twelfth hammering detection signals RHIT<9:12> when the number of input times of the ninth to twelfth active signals RACT<9:12> is greater than or equal to the set number of times. The third row hammering bank RBK3 may be implemented to include the row hammering storage circuit 241_3 and the row hammering control circuit 241_4 shown in FIG. 4.

The fourth row hammering bank RBK4 may count the number of input times of the thirteenth to sixteenth active signals RACT<13:16> for the thirteenth to sixteenth banks BK13-BK16 to generate the first to sixteenth counting signals CNT<1:16>. The fourth row hammering bank RBK4 may generate the thirteenth to sixteenth hammering detection signals RHIT<13:16> when the number of input times of the ninth to twelfth active signals RACT<13:16> is greater than or equal to the set number of times. The fourth row hammering bank RBK4 may be implemented to include the row hammering storage circuit 241_3 and the row hammering control circuit 241_4 shown in FIG. 4.

Figure 17:
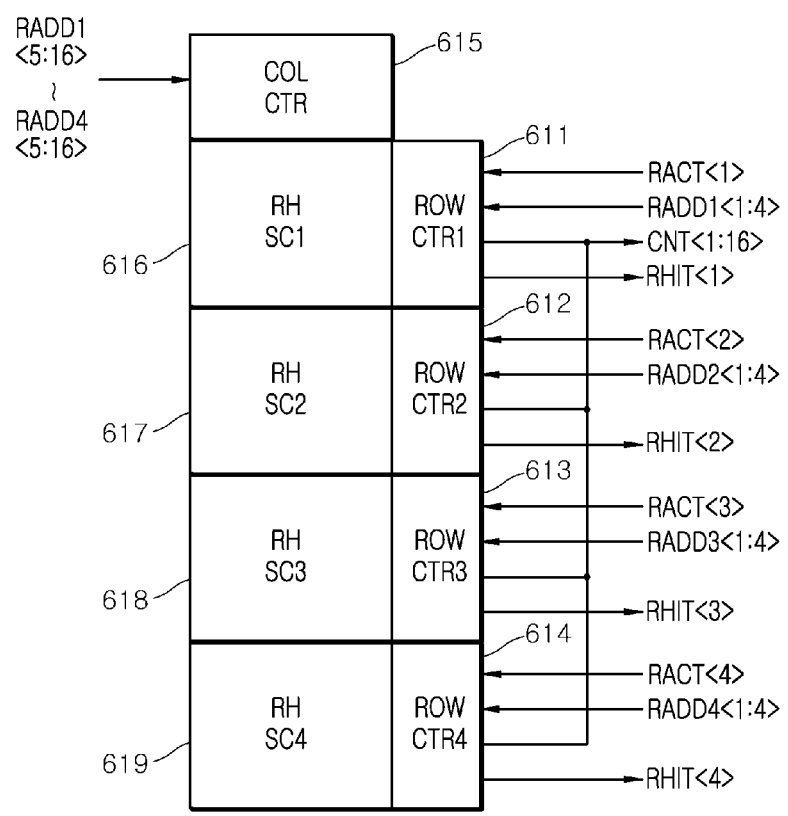
FIG. 17 is a block diagram illustrating a configuration according to an embodiment of a first row hammering bank included in the memory circuit illustrated in FIG. 16.

FIG. 17 is a block diagram illustrating a configuration according to an embodiment of the first row hammering bank RBK1a included in the memory circuit 240a illustrated in FIG. 16. As shown in FIG. 17, the first row hammering bank RBK1a may include first to fourth row control circuits 611-614, a column control circuit 615, and first to fourth row hammering storage circuits 616-619.

The first row control circuit 611 may count the number of input times of the first active signal RACT<1> for the first bank BK1 to generate the first to sixteenth counting signals CNT<1:16>. The first row control circuit 611 may generate the first hammering detection signal RHIT<1> when the number of input times of the first active signal RACT<1> is greater than or equal to the set number of times. The first row control circuit 611 may select the row path of the first row hammering storage circuit 616 by the first to fourth bits RADD1<1:4> of the internal address for the first bank BK1. The first row control circuit 611 may be implemented to include the row hammering control circuit 241_4 shown in FIG. 4.

The second row control circuit 612 may count the number of input times of the second active signal RACT<2> for the second bank BK2 to generate the first to sixteenth counting signals CNT<1:16>. The second row control circuit 611 may generate the second hammering detection signal RHIT<2> when the number of input times of the second active signal RACT<2> is greater than or equal to the set number of times. The second row control circuit 612 may select the row path of the second row hammering storage circuit 617 by the first to fourth bits RADD2<1:4> of the internal address for the second bank BK2. The second row control circuit 612 may be implemented to include the row hammering control circuit 241_4 shown in FIG. 4.

The third row control circuit 613 may count the number of input times of the third active signal RACT<3> for the third bank BK3 to generate the first to sixteenth counting signals CNT<1:16>. The third row control circuit 613 may generate the third hammering detection signal RHIT<3> when the number of input times of the third active signal RACT<3> is greater than or equal to the set number of times. The third row control circuit 613 may select the row path of the third row hammering storage circuit 618 by the first to fourth bits RADD3<1:4> of the internal address for the third bank BK3. The third row control circuit 613 may be implemented to include the row hammering control circuit 241_4 shown in FIG. 4.

The fourth row control circuit 614 may count the number of input times of the fourth active signal RACT<4> for the fourth bank BK4 to generate the first to sixteenth counting signals CNT<1:16>. The fourth row control circuit 614 may generate the fourth hammering detection signal RHIT<4> when the number of input times of the fourth active signal RACT<4> is greater than or equal to the set number of times. The fourth row control circuit 614 may select the row path of the fourth row hammering storage circuit 619 by the first to fourth bits RADD4<1:4> of the internal address for the fourth bank BK4. The fourth row control circuit 614 may be implemented to include the row hammering control circuit 241_4 shown in FIG. 4.

The column control circuit 615 may select the column path of the first row hammering storage circuit 616 by the fifth to sixteenth bits RADD1<5:16> of the internal address for the first bank BK1. The column control circuit 615 may select the column path of the second row hammering storage circuit 617 by the fifth to sixteenth bits RADD2<5:16> of the internal address for the second bank BK2. The column control circuit 615 may select the column path of the third row hammering storage circuit 618 by the fifth to sixteenth bits RADD3<5:16> of the internal address for the third bank BK3. The column control circuit 615 may select the column path of the fourth row hammering storage circuit 619 by the fifth to sixteenth bits RADD4<5:16> of the internal address for the fourth bank BK4.

The first row hammering storage circuit 616 may store and output the first to sixteenth storage counting signals (SC<1:16> of FIG. 4) in the row path that is selected by the first row control circuit 611 and in the column path that is selected by the column control circuit 615.

The second row hammering storage circuit 617 may store and output the first to sixteenth storage counting signals (SC<1:16> of FIG. 4) in the row path that is selected by the second row control circuit 612 and in the column path that is selected by the column control circuit 615.

The third row hammering storage circuit 618 may store and output the first to sixteenth storage counting signals (SC<1:16> of FIG. 4) in the row path that is selected by the third row control circuit 613 and in the column path that is selected by the column control circuit 615.

The fourth row hammering storage circuit 619 may store and output the first to sixteenth storage counting signals (SC<1:16> of FIG. 4) in the row path that is selected by the fourth row control circuit 614 and the column path that is selected by the column control circuit 615.

The arrangement structure of the components included in the first row hammering bank RBK1a will be described with reference to FIG. 17.

The first row control circuit 611 may be disposed on the right side of the first row hammering storage circuit 616, and the column control circuit 615 may be disposed on the upper side of the first row hammering storage circuit 616.

The second row hammering storage circuit 617 may be disposed below the first row hammering storage circuit 616, and the second row control circuit 612 may be disposed on the right side of the second row hammering storage circuit 617.

The third row hammering storage circuit 618 may be disposed below the second row hammering storage circuit 617, and the third row control circuit 613 may be disposed on the right side of the third row hammering storage circuit 618.

The fourth row hammering storage circuit 619 may be disposed below the third row hammering storage circuit 618, and the fourth row control circuit 614 may be disposed on the right side of the fourth row hammering storage circuit 619.

The components included in the first row hammering bank RBK1a may be disposed at various positions according to embodiments.

Figure 18:
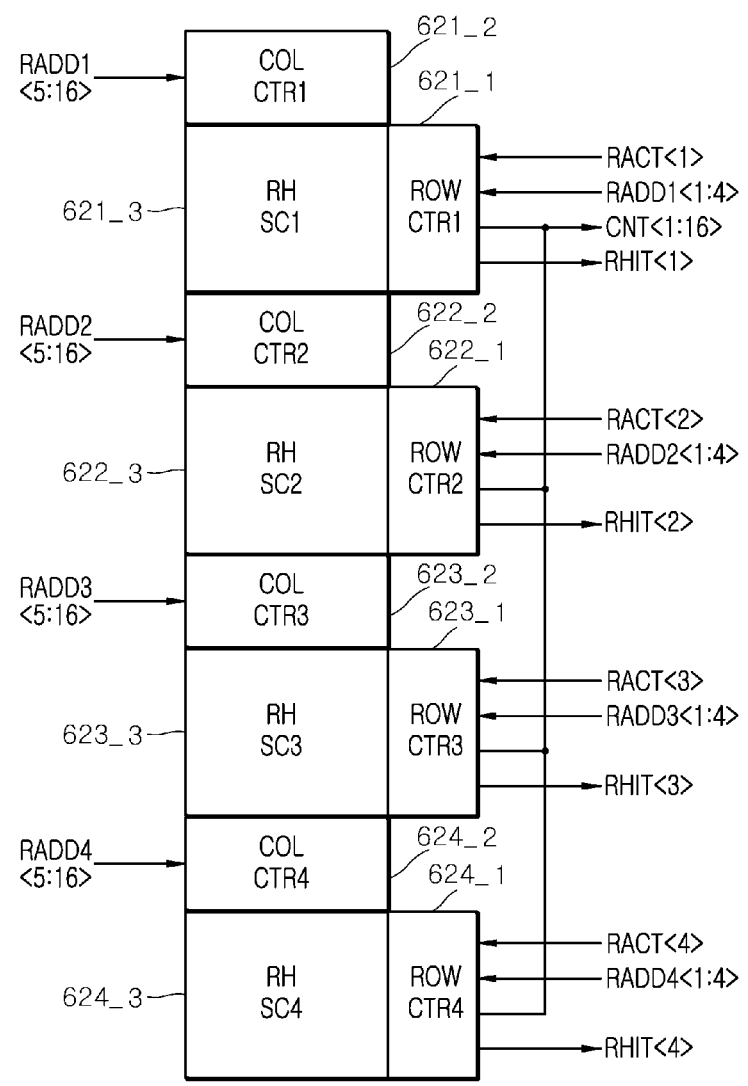
FIG. 18 is a block diagram illustrating a configuration according to another embodiment of the first row hammering bank included in the memory circuit illustrated in FIG. 16.

FIG. 18 is a block diagram illustrating a configuration according to another embodiment of the first row hammering bank RBK1b included in the memory circuit 240a illustrated in FIG. 16. As shown in FIG. 18, the first row hammering bank RBK1b may include first to fourth row control circuits 621_1-624_1, first to fourth column control circuits 621_2-624_2, and first to fourth row hammering storage circuits 621_3-624_3.

The first to fourth row control circuits 621_1-624_1 may be implemented with the same circuits as the first to fourth row control circuits 611-614 illustrated in FIG. 17 and execute the same operations, and thus, a detailed description thereof will be omitted.

The first to fourth column control circuits 621_2-624_2 may be implemented with the same circuits as the column control circuit 615 illustrated in FIG. 17 and execute the same operations, and thus, a detailed description thereof will be omitted.

The first to fourth row hammering storage circuits 621_3-624_3 may be implemented with the same circuits as the first to fourth row hammering storage circuits 616-619 illustrated in FIG. 17 and execute the same operations, and thus, a detailed description thereof will be omitted.

The arrangement structure of the components included in the first row hammering bank RBK1*b* will be described with reference to FIG. 18.

The first row control circuit 621_1 may be disposed on the right side of the first row hammering storage circuit 621_3, and the first column control circuit 621_2 may be disposed on the upper side of the first row hammering storage circuit 621_3.

The second row control circuit 622_1 may be disposed on the right side of the second row hammering storage circuit 622_3, and the second column control circuit 622_2 may be disposed between the first row hammering storage circuit 621_3 and the second row hammering storage circuit 622_3.

The third row control circuit 623_1 may be disposed on the right side of the third row hammering storage circuit 623_3, and the third column control circuit 623_2 may be disposed between the second row hammering storage circuit 622_3 and the third row hammering storage circuit 623_3.

The fourth row control circuit 624_1 may be disposed on the right side of the fourth row hammering storage circuit 624_3, and the fourth column control circuit 624_2 may be disposed between the third row hammering storage circuit 623_3 and the fourth row hammering storage circuit 624_3.

The components included in the first row hammering bank RBK1*b* may be disposed at various positions according to embodiments.

Figure 19:
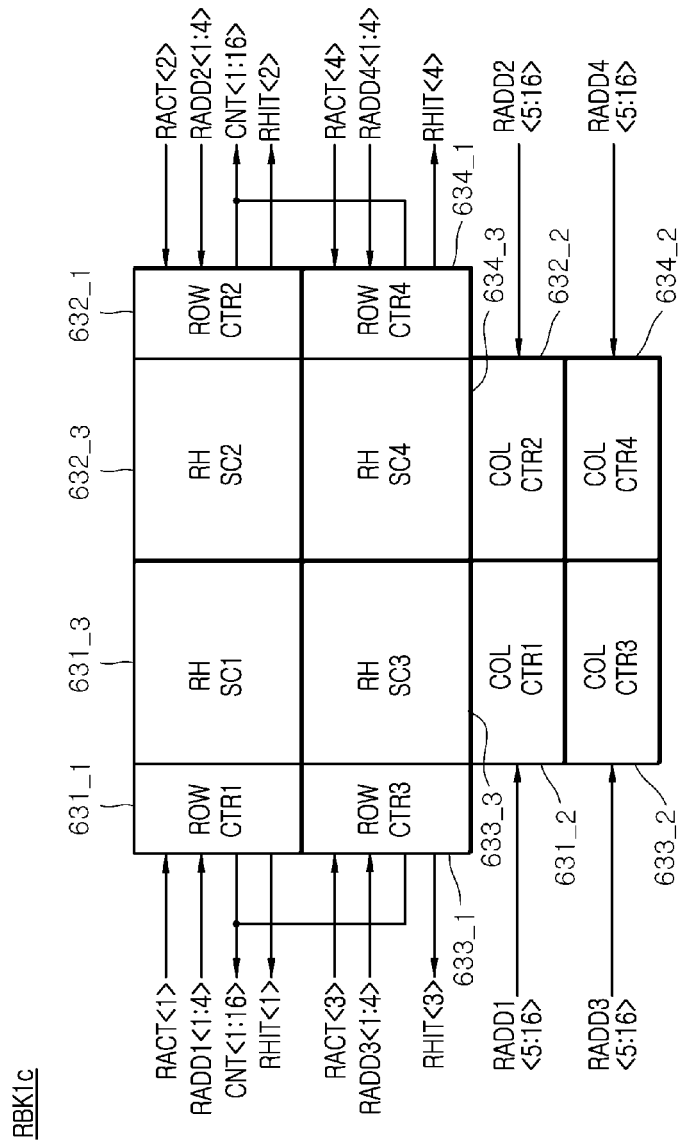
FIG. 19 is a block diagram illustrating a configuration according to yet another embodiment of the first row hammering bank included in the memory circuit illustrated in FIG. 16.

FIG. 19 is a block diagram illustrating a configuration according to yet another embodiment of the first row hammering bank RBK1*c* included in the memory circuit 240*a* illustrated in FIG. 16. As shown in FIG. 19, the first row hammering bank RBK1*c* may include first to fourth row control circuits 631_1-634_1, first to fourth column control circuits 631_2-634_2, and first to fourth row hammering storage circuits 631_3-634_3.

The first to fourth row control circuits 631_1-634_1 may be implemented with the same circuits as the first to fourth row control circuits 611-614 illustrated in FIG. 17 and execute the same operations, thus detailed descriptions will be omitted.

Each of the first to fourth column control circuits 631_2-634_2 may be implemented with the same circuit as the column control circuit 615 shown in FIG. 17 and execute the same operation, thus detailed descriptions thereof will be omitted.

The first to fourth row hammering storage circuits 631_3-634_4 may be implemented with the same circuits as the first to fourth row hammering storage circuits 616-619 shown in FIG. 17 and execute the same operations, thus detailed descriptions thereof will be omitted.

The arrangement structure of the components included in the first row hammering bank RBK1*c* will be described with reference to FIG. 19.

The first row control circuit 631_1 may be disposed on the left side of the first row hammering storage circuit 631_3.

The second row hammering storage circuit 632_3 may be disposed on the right side of the first row hammering storage circuit 631_3, and the second row control circuit 632_1 may be disposed on the right side of the second row hammering storage circuit 632_3.

The third row hammering storage circuit 633_3 may be disposed below the first row hammering storage circuit 631_3.

The third row control circuit 633_1 may be disposed below the first row control circuit 631_1 and on the left side of the third row hammering storage circuit 633_3.

The fourth row hammering storage circuit 634_3 may be disposed on the right side of the third row hammering storage circuit 633_3, and the fourth row control circuit 634_1 may be disposed below the third row control circuit 633_1 and on the right side of the fourth row hammering storage circuit 634_3.

The first column control circuit 631_2 may be disposed below the third row hammering storage circuit 633_3, and the second column control circuit 632_2 may be disposed below the fourth row hammering storage circuit 634_3.

The third column control circuit 633_2 may be disposed below the first column control circuit 631_2, and the fourth column control circuit 634_2 may be disposed below the second column control circuit 632_2.

The components included in the first row hammering bank RBK1*c* may be disposed at various positions according to embodiments.

Figure 20:
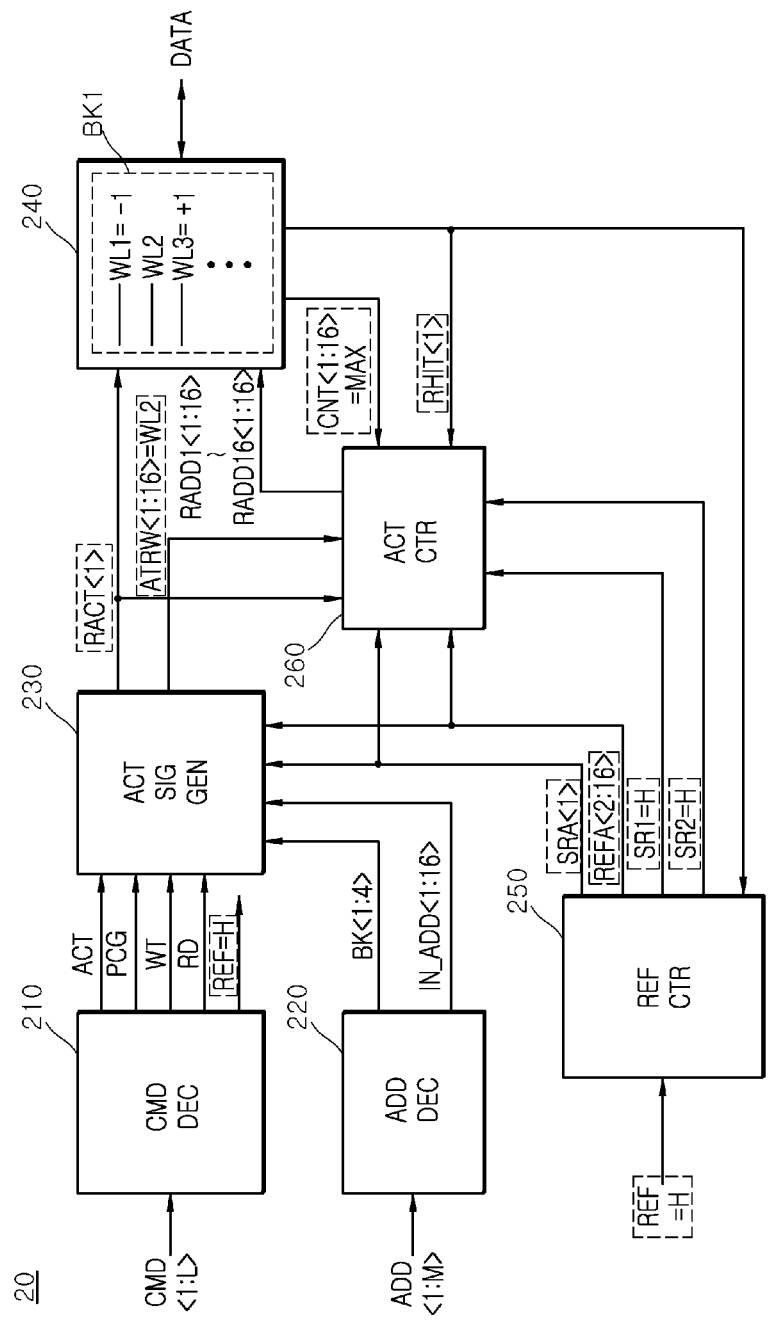
FIG. 20 is a block diagram illustrating an operation of a semiconductor system according to an embodiment of the present disclosure.

FIG. 20 is a block diagram illustrating an operation of a semiconductor system 20 according to an embodiment of the present disclosure. The refresh operation will be described in the case in which the active operation of the first bank BK1 is executed in a set number of times or more with reference to FIG. 20, and the operation of executing a smart refresh operation on the word line adjacent to the second word line WL2 of the first bank BK1 in the refresh operation will be described below.

A command decoder 210 may decode first to "L"$^{th}$ commands CMD<1:L> to generate a refresh command REF of a logic "high" level H for executing a refresh operation.

An address decoder 220 may generate first to fourth bank addresses BK<1:4> and first to sixteenth input addresses IN_ADD<1:16> for selecting the first bank BK1, based on first to "M"$^{th}$ addresses ADD<1:M>.

An active signal generating circuit 230 may generate first active signal RACT<1>, based on the first to fourth bank addresses BK<1:4> in an active operation. The active signal generating circuit 230 may generate first to sixteenth active addresses ATRW<1:16> for selecting the second word line WL2, based on the first to sixteenth input addresses IN_ADD<1:16> in the active operation.

The first bank BK1 of a memory circuit 240 may count the number of input times of a first active signal RACT<1> to generate first to sixteenth counting signals CNT<1:16> that have a maximum value MAX. The first bank BK1 of the memory circuit 240 may generate the first hammering detection signal RHIT<1> when the number of input times of the first active signal RACT<1> is greater than or equal to a set number of times.

The refresh control circuit 250 may generate second to sixteenth refresh active signals REFA<2:16> and the first smart refresh active signal SRA<1>, based on the refresh command REF of a logic "high" level H and the first hammering detection signal RHIT<1>. The refresh control circuit 250 may generate a first smart refresh signal SR1 of a logic "high" level H for executing a smart refresh operation, based on the refresh command REF of a logic "high" level H and the first hammering detection signal RHIT<1>.

The active control signal 260 may store the first to sixteenth active addresses ATRW<1:16> as first to sixteenth target addresses (TG_ADD<1:16> of FIG. 11) when the first hammering detection signal RHIT<1> is enabled. The active control signal 260 may execute addition and subtraction operations on the first to sixteenth target addresses (TG_ADD<1:16> of FIG. 11) in order to execute a smart refresh operation, based on the first to sixteenth counting signals CNT<1:16> in a refresh operation. The active control signal 260 may generate an internal address RADD1<1:16> for the first bank BK1 for selecting the third word line WL3 of the first bank BK1 to which the first to sixteenth target addresses (TG_ADD<1:16> in FIG. 11) are added (+1), based on the first smart refresh active signal SRA<1> and the first smart refresh signal SR1 of logic "high" levels H. In this case, the third word line WL3 may be a word line adjacent to the second word line WL2. The active control circuit 260 may generate the internal addresses RADD2<1: 16>-RADD16<1:16> for the second to sixteenth banks BK2-BK16 that are sequentially counted, based on the second to sixteenth refresh active signals REFA<2:16> in the refresh operation.

The third word line WL3 included in the first bank BK1 of the memory circuit 240 may be activated by the first active signal RACT<1> and the internal address RADD1<1: 16> for the first bank BK1 to execute a smart refresh operation. The second to sixteenth banks BK2-BK16 of the memory circuit 240 may be activated by the internal addresses RADD2<1:16>-RADD16<1:16> for the second to sixteenth banks BK2-BK16 to execute the refresh operation.

The refresh control circuit 250 may generate a first smart refresh signal SR1 of a logic "high" level H for executing a smart refresh operation, based on the refresh command REF of a logic "high" level H and the first hammering detection signal RHIT<1>, and then may generate a second smart refresh signal SR2 of a logic "high" level H.

The active control circuit 260 may generate the internal address RADD1<1:16> for the first bank BK1 for selecting the first word line WL1 of the first bank BK1 from which the first to sixteenth target addresses (TG_ADD<1:16> in FIG. 11) are subtracted (−1), based on the first smart refresh active signal SRA<1> and the second smart refresh signal SR2 of a logic "high" level H. In this case, the first word line WL1 may be a word line adjacent to the second word line WL2.

The first word line WL1 included in the first bank BK1 of the memory circuit 240 may be activated by the first active signal RACT<1> and the internal address RADD1<1:16> for the first bank BK1 to execute a smart refresh operation.

As described above, the semiconductor system 1 according to an embodiment of the present disclosure may selectively execute a smart refresh operation on the bank that is most activated among the plurality of banks in a refresh operation. The semiconductor system 1 may execute an efficient refresh operation by executing the smart refresh operation on the bank that is most activated in the refresh operation and executing the refresh operation on the remaining banks.

Figure 21:
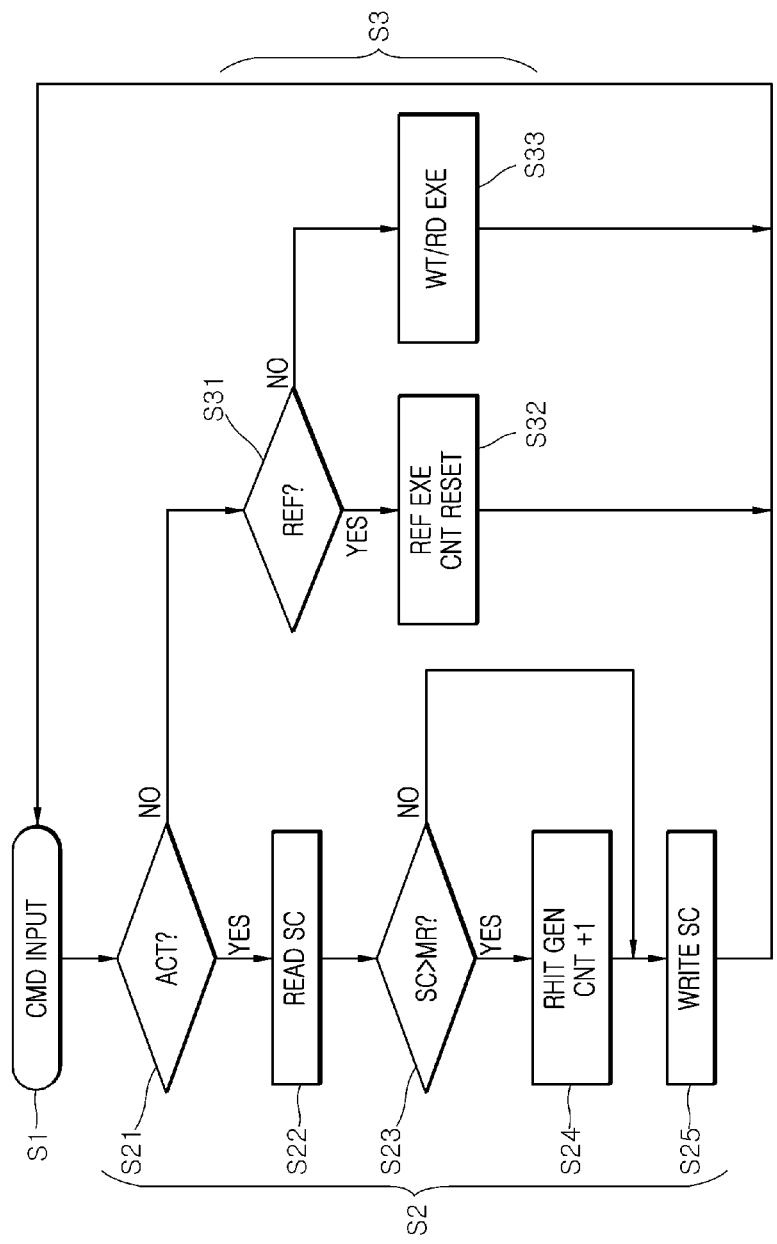
FIG. 21 is a flowchart illustrating an operation of a semiconductor system according to an embodiment of the present disclosure.

FIG. 21 is a flowchart illustrating the operation of a semiconductor system according to an embodiment of the present disclosure. The operation of a semiconductor system according to the embodiment may be applied to the semiconductor system 1 of FIG. 1. The smart refresh operation of the semiconductor system 1 according to an embodiment of the present disclosure will be described with reference to FIG. 21.

The smart refresh operation may include a command input step S1, an active detection step S2, and an operation execution step S3.

The command input step S1 may be set as a step in which the controller 10 outputs the first to "L"$^{th}$ commands CMD<1:L> and the first to "M"$^{th}$ addresses ADD<1:M>.

The active detection step S2 may include an active command detection step S21, a storage counting signal read step S22, a storage counting signal comparing step S23, a hammering detection signal generation and counting step S24, and a storage counting signal write step S25.

The active command detection step S21 may be set as a step of detecting whether the command decoder 210 generates the active command ACT, based on the first to "L"$^{th}$ commands CMD<1:L> and the active signal generating circuit 230 generates the first to sixteenth active signals RACT<1:16>. When the command decoder 210 generates the active command ACT, based on the first to Lth commands CMD<1:L> and the active signal generating circuit 230 generates the first to sixteenth active signals RACT<1: 16> (YES), the storage counting signal read step S22 may be entered. When the command decoder 210 does not generate the active command ACT based on the first to "L"$^{th}$ commands CMD<1:L> and the active signal generating circuit 230 does not generate the first to sixteenth active signals RACT<1:16> (NO), a refresh detection step S31 of the operation execution step S3 may be entered.

The storage counting signal read step S22 may be set as a step of outputting the first to sixteenth storage counting signals SC<1:16> that are stored in the row hammering storage circuit 241_3 when an internal read signal IRD is enabled in an active operation.

The storage counting signal comparing step S23 may be set as a step in which the row hammering control circuit 241_4 compares the first to sixteenth storage counting signals SC<1:16> with the first to sixteenth mode register signals MR<1:16> including information on the set number, based on the internal read signal IRD and the first active signal RACT<1>. When the first to sixteenth storage counting signals SC<1:16> are counted as having bit combinations of the first to sixteenth mode register signals MR<1: 16> or higher in the storage counting signal comparing step S23 (YES), the hammering detection signal generation and counting step S24 may be entered. When the first to sixteenth storage counting signals SC<1:16> are counted as having bit combinations lower than the bit combinations of the first to sixteenth mode register signals MR<1:16> in the storage counting signal comparing step S23 (NO), the storage counting signal write step S25 may be entered.

The hammering detection signal generation and counting step S24 may be set as a step of generating the first to sixteenth hammering detection signals RHIT<1:16> that are enabled when the first to sixteenth storage counting signals SC<1:16> are counted to have a combination that is higher than or equal to the combination of the first to sixteenth mode register signals MR<1:16> (YES) and up-counting the first to sixteenth storage counting signals SC<1:16> once (+1). When the first to sixteenth hammering detection signals RHIT<1:16> are enabled in the hammering detection signal generation and counting step S24, the first to sixteenth active addresses ATRW<1:16> may be stored as the first to sixteenth target addresses TG_ADD<1:16>. When the hammering detection signal generation and counting step S24 is finished, the storage counting signal write step S25 may be entered.

The storage counting signal write step S25 may be set as a step of storing the first to sixteenth storage counting signals SC<1:16> that are up-counted or not up-counted in the row hammering storage circuit 241_3 when an internal write signal IWT is enabled in the active operation. When the storage counting signal write step S25 is finished, the command input step S1 may be entered.

The operation execution step S3 may include the refresh detection step S31, a refresh execution and counting signal reset step S32, and a write operation and read operation execution step S33.

The refresh detection step S31 may be set as a step of detecting whether the command decoder 210 generates the refresh command REF based on the first to "L"th commands CMD<1:L>. When the command decoder 210 generates the refresh command REF based on the first to "L"th commands CMD<1:L> (YES), the refresh execution and counting signal reset step S32 may be entered. When the command decoder 210 does not generate the refresh command REF based on the first to "L"th commands CMD<1:L> (NO), the write operation and read operation execution step S33 may be entered.

The refresh execution and counting signal reset step S32 may be set as a step of executing a refresh operation on the bank in which the first to sixteenth hammering detection signals RHIT<1:16> are disabled, and executing a smart refresh operation on the bank in which the first to sixteenth hammering detection signals RHIT<1:16> are enabled. In the refresh execution and counting signal reset step S32, the bank in which the first to sixteenth hammering detection signals RHIT<1:16> are disabled may execute the refresh operation. In the refresh execution and counting signal reset step S32, the bank in which the first to sixteenth hammering detection signals RHIT<1:16> are enabled may execute the addition and subtraction operations on the first to sixteenth target addresses TG_ADD<1:16> to execute a smart refresh operation on adjacent word lines. In the refresh execution and counting signal reset step S32, the first to sixteenth storage counting signals SC<1:16> may be initialized by the refresh command REF. In the refresh execution and counting signal reset step S32, the first to sixteenth target addresses TG_ADD<1:16> may be initialized by the refresh command REF. When the refresh execution and counting signal reset step S32 is finished, the command input step S1 may be entered.

The write operation and read operation execution step S33 may be set as a step of detecting whether the command decoder 210 generates the write command WT and the read command RD, based on the first to "L"th commands CMD<1:L> to execute the write operation and read operation. When the command decoder 210 generates a write command WT, based on the first to "L"th commands CMD<1:L>, data DATA may be stored in the bank that is selected from among the first to sixteenth banks BK-BK16. When the command decoder 210 generates a read command RD, based on the first to Lth commands CMD<1:L>, the data DATA stored in the bank that is selected from among the first to sixteenth banks BK1-BK16 may be output. When the write operation and read operation execution step S33 is finished, the command input step S1 may be entered.

Such a smart refresh operation according to an embodiment of the present disclosure may selectively execute the smart refresh operation on the bank that is most activated among a plurality of banks in the refresh operation. In the smart refresh operation, an efficient refresh operation may be executed by executing the smart refresh operation on the bank that is most activated in the refresh operation and executing a refresh operation on the remaining banks.

Figure 22:
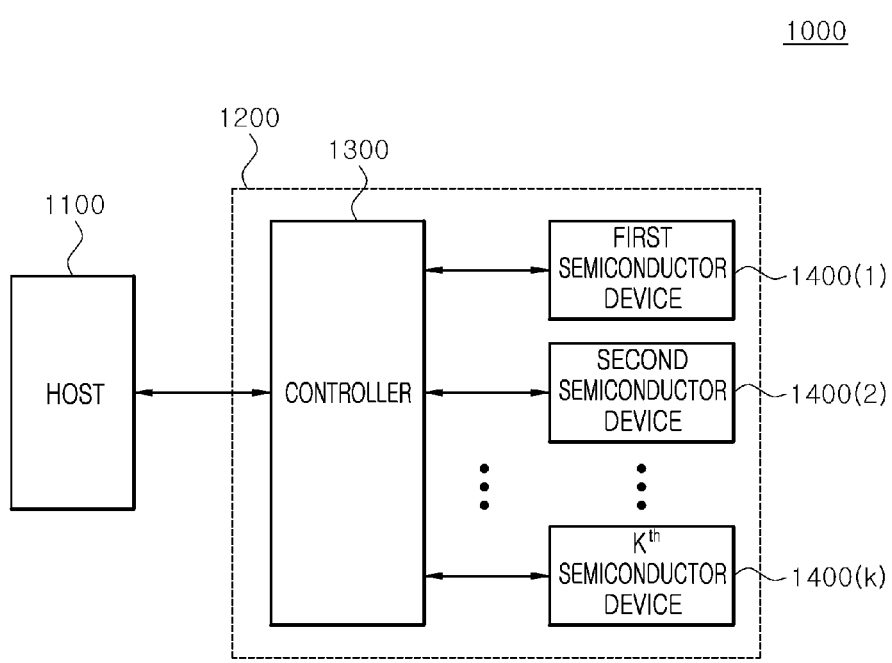
FIG. 22 is a block diagram illustrating a configuration according to an embodiment of an electronic system to which the semiconductor system illustrated in FIGS. 1 to 21 is applied.

FIG. 22 is a diagram illustrating a configuration according to an embodiment of an electronic system 1000 to which the semiconductor systems illustrated in FIGS. 1 to 21 may be applied. As shown in FIG. 22, the electronic system 1000 may include a host 1100 and a semiconductor system 1200.

The host 1100 and the semiconductor system 1200 may transmit signals to each other using an interface protocol. The interface protocol used between the host 1100 and the semiconductor system 1200 may include multi-media card (MMC), enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), or the like.

The semiconductor system 1200 may include a controller 1300 and semiconductor devices 1400(K:1). The controller 1300 may control the semiconductor devices 1400(K:1) to execute active operations, write operations, read operations, and refresh operations. Each of the semiconductor devices 1400(K:1) may selectively execute a smart refresh operation on the bank that is most activated among a plurality of banks in the refresh operation. Each of the semiconductor devices 1400(K:1) may execute an efficient refresh operation by executing a smart refresh operation on the bank that is most activated and executing the refresh operation on the remaining banks in the refresh operation. Each of the semiconductor devices 1400(K:1) may execute an active operation, a write operation, and a read operation.

The controller 1300 may be implemented as the controller 10 shown in FIG. 1. Each of the semiconductor devices 1400(K:1) may be implemented as the semiconductor device 20 shown in FIG. 1. According to an embodiment, the electronic devices 1400(K:1) may be implemented with one of a dynamic random access memory (DRAM) device, a phase change random access memory (PRAM) device, a resistive random access memory (RRAM) device, a magnetic random access memory (MRAM) device, and a ferroelectric random access memory (FRAM) device.

The present teachings have been disclosed in conjunction with some embodiments as described above. Those skilled in the art will appreciate that various modifications, additions, and/or substitutions are possible, without departing from the scope and spirit of the present disclosure. Accordingly, the embodiments disclosed in the present specification should be considered from not a restrictive standpoint but an illustrative standpoint. The scope of the present teachings is not limited to the above descriptions but is defined by the accompanying claims, and all of distinctive features in the equivalent scope should be construed as being included in the present teachings.

What is claimed is:

1. A semiconductor device comprising:
   a memory circuit including first and second banks, the memory circuit configured to count numbers of input times of first and second active signals for executing an active operation on the first and second banks to generate a counting signal and to generate first and second hammering detection signals when the numbers of input times of the first and second active signals are equal to or greater than a set number of times; and
   an active control circuit configured to store an active address as a target address when at least one of the first and second hammering detection signals is enabled, and to execute addition and subtraction operations on the target address to output a result of the addition and subtraction operations as an internal address for at least one of the first and second banks for executing a smart refresh operation, based on the counting signal in a refresh operation.

2. The semiconductor device of claim 1,
   wherein the first bank is configured to store the counting signal obtained by counting the number of input times of the first active signal, and
   wherein the second bank is configured to store the counting signal obtained by counting the number of input times of the second active signal.

3. The semiconductor device of claim 1,
   wherein the second bank is configured to execute the refresh operation based on the first active signal and the internal address for the second bank, when the smart refresh operation for the first bank is executed based on the first active signal and the internal address for the first bank, and wherein the first bank is configured to execute the refresh operation based on the first active signal and the internal address for the first bank, when the smart refresh operation for the second bank is executed based on the second active signal and the internal address for the second bank.

4. The semiconductor device of claim 1, wherein the first bank includes:
- a first memory cell array configured to input and output data based on the first active signal and the internal address for the first bank, and to execute the refresh operation and the smart refresh operation based on the first active signal and the internal address for the first bank;
- a first row hammering storage circuit configured to output a stored first storage counting signal when an internal read signal is enabled, and to store the first storage counting signal when an internal write signal is enabled, in the active operation; and
- a first row hammering control circuit configured to up-count the first storage counting signal when the internal read signal is enabled and the first active signal is input, to output the up-counted first storage counting signal as the counting signal, to generate the first hammering detection signal when the number of counting times of the first storage counting signal is equal to or greater than a set number of times, and to output the up-counted first storage counting signal to the first row hammering storage circuit when the internal write signal is enabled.

5. The semiconductor device of claim 4, wherein the first row hammering storage circuit is configured to initialize the first storage counting signal when a refresh command is enabled in the refresh operation.

6. The semiconductor device of claim 4, wherein the first row hammering control circuit includes:
- a first internal counting signal generating circuit configured to up-count the first storage counting signal when the internal read signal is enabled and the first active signal is input, and to generate a first internal counting signal from the up-counted first storage counting signal;
- a first counting signal output circuit configured to generate the first storage counting signal from the first internal counting signal when the internal write signal is input and the first active signal is input to output the first storage counting signal to the first row hammering storage circuit, and to generate and output the counting signal from the first internal counting signal; and
- a first comparison circuit configured to generate the first hammering detection signal when the first storage counting signal is up-counted than a mode counting signal including information on the set number of times.

7. The semiconductor device of claim 1, wherein the second bank includes:
- a second memory cell array configured to input and output data based on the second active signal and the internal address for the second bank, and to execute the refresh operation and the smart refresh operation based on the second active signal and the internal address for the second bank;
- a second row hammering storage circuit configured to output a stored second storage counting signal when an internal read signal is enabled in the active operation, and to store the second storage counting signal when an internal write signal is enabled; and
- a second row hammering control circuit configured to up-count the second storage counting signal when the internal read signal is enabled and the second active signal is input, to output the up-counted second storage counting signal as the counting signal, to generate the second hammering detection signal when the number of counting times of the second storage counting signal is equal to or greater than the set number of times, and to output the up-counted second storage counting signal to the second row hammering storage circuit when the internal write signal is enabled.

8. The semiconductor device of claim 7, wherein the second row hammering storage circuit is configured to initialize the second storage counting signal when a refresh command is enabled in the refresh operation.

9. The semiconductor device of claim 7, wherein the second row hammering control circuit includes:
- a second internal counting signal generating circuit configured to up-count the second storage counting signal when the internal read signal is enabled and the second active signal is input, and to generate a second internal counting signal from the up-counted second storage counting signal;
- a second counting signal output circuit configured to generate the second storage counting signal from the second internal counting signal when the internal write signal is input and the second active signal is input to output the second storage counting signal to the second row hammering storage circuit, and to generate the counting signal from the second internal counting signal to output the counting signal; and
- a second comparison circuit configured to generate the second hammering detection signal when the second storage counting signal is up-counted than the mode counting signal including information on the set number of times.

10. The semiconductor device of claim 1, further comprising a refresh control circuit configured to generate first and second smart refresh signals for executing the smart refresh operation based on the first and second hammering detection signals in the refresh operation, and to generate first and second refresh active signals or first and second smart refresh active signals, based on the refresh command.

11. The semiconductor device of claim 10,
wherein the refresh control circuit is configured to generate the first and second refresh active signals from the refresh command when both the first and second hammering detection signals are disabled, and
wherein the refresh control circuit is configured to generate the second refresh active signal and the first smart refresh active signal that are enabled from the refresh command when the first hammering detection signal is enabled, and generate the first refresh active signal and the second smart refresh active signal that are enabled from the refresh command when the second hammering detection signal is enabled.

12. The semiconductor device of claim 10, wherein the refresh control circuit includes:
- an internal refresh signal generating circuit configured to generate an internal refresh signal that is enabled when the refresh command is enabled;

a smart refresh control circuit configured to generate the first and second smart refresh signals that are sequentially enabled based on the refresh command when one of the first and second hammering detection signals is enabled, and to generate an internal smart refresh signal that is enabled when one of the first and second smart refresh signals is enabled; and a refresh active signal generating circuit configured to generate the first and second refresh active signals or the first and second smart refresh active signals, based on the first and second hammering detection signals when the internal refresh signal and the internal smart refresh signal are enabled.

13. The semiconductor device of claim 12, wherein the internal refresh signal generating circuit includes:
a refresh control signal generating circuit configured to generate a refresh control signal including a pulse that is generated for a predetermined period when the refresh command is enabled; and
a delay circuit configured to delay the refresh control signal to generate the internal refresh signal.

14. The semiconductor device of claim 12, wherein the smart refresh control circuit includes:
a first smart refresh control signal generating circuit configured to generate the first smart refresh signal including a pulse that is generated for a predetermined period when the first and second hammering detection signals and the refresh command are enabled;
a second smart refresh control signal generating circuit configured to generate the second smart refresh signal including a pulse that is generated for a predetermined period based on the first smart refresh signal; and
an internal smart refresh signal generating circuit configured to generate the internal smart refresh signal that is enabled when one of the first smart refresh signal and the second smart refresh signal is enabled.

15. The semiconductor device of claim 12,
wherein the refresh active signal generating circuit is configured to generate the first and second refresh active signals when both the first and second hammering detection signals are disabled during a period in which the internal refresh signal and the internal smart refresh signal are enabled, and
wherein the refresh active signal generating circuit is configured to generate the first smart refresh active signal when the first hammering detection signal is enabled during a period in which the internal refresh signal and the internal smart refresh signal are enabled, and the refresh active signal generating circuit is configured to generate the second smart refresh active signal when the second hammering detection signal is enabled during a period in which the internal refresh signal and the internal smart refresh signal are enabled.

16. A semiconductor device comprising:
a bank configured to count the number of input times of an active signal for executing an active operation to generate a counting signal, to store the counting signal, and to generate a hammering detection signal when the number of input times of the active signal is equal to or greater than a set number of times; and
a refresh control circuit configured to generate first and second smart refresh signals for executing a smart refresh operation based on the hammering detection signal in a refresh operation, and to generate one of a refresh active signal and a smart refresh active signal, based on a refresh command.

17. The semiconductor device of claim 16,
wherein the bank is configured to execute the refresh operation based on the active signal and the internal address that is sequentially counted when the hammering detection signal is disabled in the refresh operation, and
wherein the bank is configured to execute the smart refresh operation based on the internal address that is generated by adding and subtracting the active signal and the target address when the hammering detection signal is enabled in the refresh operation.

18. The semiconductor device of claim 16, wherein the bank includes:
a memory cell array configured to input and output data based on the active signal and the internal address, and to execute the refresh operation and the smart refresh operation based on the active signal and the internal address;
a row hammering storage circuit configured to output a stored storage counting signal when an internal read signal is enabled in the active operation, and to store the storage counting signal when an internal write signal is enabled; and
a row hammering control circuit configured to up-count the storage counting signal when the internal read signal is enabled and the active signal is input, to output the up-counted storage counting signal as the counting signal, to generate the hammering detection signal when the number of counting times of the storage counting signal is equal to or greater than the set number of times, and to output the up-counted storage counting signal to the row hammering storage circuit when the internal write signal is enabled.

19. The semiconductor device of claim 16,
wherein the refresh control circuit is configured to generate the refresh active signal from the refresh command when the hammering detection signal is disabled,
wherein the refresh control circuit is configured to generate the smart refresh active signal from the refresh command when the hammering detection signal is enabled, and
wherein the refresh control circuit is configured to generate the first and second smart refresh signals from the refresh command when the hammering detection signal is enabled.

20. The semiconductor device of claim 16, wherein the refresh control circuit includes:
an internal refresh signal generating circuit configured to generate an internal refresh signal that is enabled when the refresh command is enabled;
a smart refresh control circuit configured to generate the first and second smart refresh signals that are sequentially enabled based on the refresh command when the hammering detection signal is enabled, and to generate an internal smart refresh signal that is enabled when one of the first and second smart refresh signals is enabled; and
a refresh active signal generating circuit configured to generate one of the refresh active signal and the smart refresh active signal, based on the hammering detection signal when the internal refresh signal and the internal smart refresh signal are enabled.

21. The semiconductor device of claim 20, wherein the internal refresh signal generating circuit includes:
a refresh control signal generating circuit configured to generate a refresh control signal including a pulse that is generated for a predetermined period when the refresh command is enabled; and a delay circuit configured to delay the refresh control signal to generate the internal refresh signal.

22. The semiconductor device of claim 20, wherein the smart refresh control circuit includes:
a first smart refresh control signal generating circuit configured to generate the first smart refresh signal including a pulse that is generated for a predetermined period when the hammering detection signal and the refresh command are enabled;
a second smart refresh control signal generating circuit configured to generate the second smart refresh signal including a pulse that is generated for a predetermined period based on the first smart refresh signal; and
an internal smart refresh signal generating circuit configured to generate the internal smart refresh signal that is enabled when one of the first smart refresh signal and the second smart refresh signal is enabled.

23. The semiconductor device of claim 20,
wherein the refresh active signal generating circuit is configured to generate the refresh active signal when the hammering detection signal is disabled during a period in which the internal refresh signal and the internal smart refresh signal are enabled, and
wherein the refresh active signal generating circuit is configured to generate the smart refresh active signal when the hammering detection signal is enabled during a period in which the internal refresh signal and the internal smart refresh signal are enabled.

24. The semiconductor device of claim 16, further comprising an active signal generating circuit configured to generate the active signal based on a bank address in the active operation, to generate an active address based on an input address, and to generate the active signal from one of the refresh active signal and the smart refresh active signal in the refresh operation.

25. The semiconductor device of claim 24, wherein the active signal generating circuit includes:
an address transfer circuit configured to generate the active signal based on the bank address during a period in which an active command is input, to generate the active signal that is disabled during a period in which a pre-charge command is input, and to generate the active signal from one of the refresh active signal and the smart refresh active signal in the refresh operation; and
an active address generating circuit configured to generate the active address based on the input address during a period in which one of the active command, a write command, and a read command is input.

26. The semiconductor device of claim 25, wherein the address transfer circuit includes:
a bank address decoder configured to generate a bank decoding signal based on the bank address;
a transfer address generating circuit configured to transfer the bank decoding signal as a transfer address during a period in which the active command is input, and to generate the transfer address that is disabled during a period in which the pre-charge command is input; and
an active signal synthesizing circuit configured to generate the active signal from one of the transfer address, the refresh active signal, and the smart refresh active signal.

27. A smart refresh method comprising:
performing an active detecting step of detecting numbers of input times of first and second active signals in an active operation, generating first and second hammering detection signals when the numbers of input times of the first and second active signals are equal to or greater than a set number of times, respectively, and storing a target address; and
performing an operation executing step of executing addition and subtraction operations on the target address to execute a smart refresh operation on one of first and second banks when one of the first and second hammering detection signals is enabled in a refresh operation, and executing the refresh operation on the bank on which the smart refresh operation is not executed among the first and second banks.

28. The smart refresh method of claim 27, wherein the first bank stores a counting signal that is obtained by counting the number of input times of the first active signal, and the second bank stores the counting signal that is obtained by counting the number of input times of the second active signal.

29. The smart refresh method of claim 27, wherein performing the active detecting step includes:
performing an active command detecting step of detecting generation of an active command and the first and second active signals in the active operation;
performing a storage counting signal reading step of outputting first and second storage counting signals that are stored in first and second row hammering storage circuits included in the first and second banks, respectively, when an internal read signal is enabled;
performing a storage counting signal comparing step of comparing the first and second storage counting signals with a mode register signal including information on the numbers of input times of the first and second active signals; and
performing a hammering detection signal generating and counting step of generating the first and second hammering detection signals when the first and second storage counting signals are counted more than the mode register signal, and storing the target address.

30. The smart refresh method of claim 27, wherein performing the operation executing step includes:
performing a refresh detecting step of detecting generation of a refresh command in performing the refresh operation; and
performing a refresh executing and counting signal reset step of executing the refresh operation on one of the first and second banks in which the first and second hammering detection signals are disabled when the refresh command is generated, and executing addition and subtraction operations on the target address for one of the first and second banks in which the first and second hammering detection signals are enabled to execute the smart refresh operation.

31. The smart refresh method of claim 30, wherein performing the refresh executing and counting signal reset step comprises initializing the target address when the refresh command is generated.

* * * * *